(12) United States Patent
Kaya et al.

(10) Patent No.: US 9,985,091 B2
(45) Date of Patent: May 29, 2018

(54) SEMICONDUCTOR DEVICE

(71) Applicant: Renesas Electronics Corporation, Tokyo (JP)

(72) Inventors: Yoshinori Kaya, Tokyo (JP); Yasushi Nakahara, Tokyo (JP); Ryo Kanda, Tokyo (JP); Tetsu Toda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 14/977,355

(22) Filed: Dec. 21, 2015

(65) Prior Publication Data
US 2016/0148995 A1 May 26, 2016

Related U.S. Application Data

(63) Continuation of application No. 14/638,996, filed on Mar. 4, 2015, now Pat. No. 9,324,862.

(30) Foreign Application Priority Data

Mar. 20, 2014 (JP) .................................. 2014-059016

(51) Int. Cl.
*H01L 29/06* (2006.01)
*H01L 29/40* (2006.01)
(Continued)

(52) U.S. Cl.
CPC ...... *H01L 29/0619* (2013.01); *H01L 27/0207* (2013.01); *H01L 29/402* (2013.01);
(Continued)

(58) Field of Classification Search
CPC . H01L 27/0207; H01L 29/402; H01L 29/404; H01L 29/0619
See application file for complete search history.

(56) References Cited

U.S. PATENT DOCUMENTS 9,443,966 B2  9/2016  Yamaji
2002/0135019 A1*  9/2002  Noda ............... H01L 29/7835
257/367
(Continued)

FOREIGN PATENT DOCUMENTS

JP  H04-332173 A  11/1992
JP  H11-330456 A  11/1999
(Continued)

OTHER PUBLICATIONS

Extended European Search Report dated Aug. 7, 2015.
(Continued)

*Primary Examiner* — Andres Munoz
*Assistant Examiner* — Maria Ligai
(74) *Attorney, Agent, or Firm* — McGinn IP Law Group, PLLC.

(57) ABSTRACT

A semiconductor device including a first circuit region in which a first circuit whose power supply potential is a first voltage is formed; a second circuit region in which a second circuit whose power supply potential is a second voltage lower than the first voltage is formed a separation region which separates the first circuit region from the second circuit region; and a transistor which is located in the separation region and couples the second circuit to the first circuit and whose source and drain are of a first conductivity type, the separation region including an element separation film; a first field plate which overlaps with the element separation film in plan view; a plurality of conductive films which are provided over the first field plate.

30 Claims, 31 Drawing Sheets

(51) Int. Cl.
  *H01L 29/78* (2006.01)
  *H01L 27/02* (2006.01)
  *H03K 19/0175* (2006.01)
  *H01L 27/092* (2006.01)
  *H01L 29/423* (2006.01)

(52) U.S. Cl.
  CPC .......... *H01L 29/404* (2013.01); *H01L 29/405* (2013.01); *H01L 29/407* (2013.01); *H01L 29/7816* (2013.01); *H01L 29/7835* (2013.01); *H03K 19/017509* (2013.01); *H01L 27/092* (2013.01); *H01L 29/42368* (2013.01)

(56) References Cited

U.S. PATENT DOCUMENTS

| | | | |
|---|---|---|---|
| 2005/0140012 A1* | 6/2005 | Jung | H01L 21/76801 257/762 |
| 2005/0161761 A1 | 7/2005 | Hatade | |
| 2005/0194656 A1* | 9/2005 | Shimizu | H01L 29/0878 257/488 |
| 2013/0032895 A1 | 2/2013 | Disney et al. | |
| 2013/0341751 A1 | 12/2013 | Ono et al. | |

FOREIGN PATENT DOCUMENTS

| | | |
|---|---|---|
| JP | 2005-209983 A | 8/2005 |
| JP | 2010-080891 A | 4/2010 |
| WO | WO 2013/069408 A1 | 5/2013 |

OTHER PUBLICATIONS

Manabu Yoshino, et al.: "1,200 V HVIC Technology for Power Inverter System", Sep. 2013, XP055204642, Retrieved from the Internet URL: http://203.178..93.33/company/rd/advance/pdf/vol143/143_TR4.pdf [retrieved on Jul. 24, 2015].

U.S. Notice of Allowance dated Sep. 3, 2015 in U.S. Appl. No. 14/638,996.

Japanese Notification of Reasons for Refusal dated May 23, 2017 in Japanese Application No. 2014-059016 with an English translation thereof.

* cited by examiner

SEMICONDUCTOR DEVICE

CROSS-REFERENCE TO RELATED APPLICATIONS

The present application is a Continuation application of U.S. patent application Ser. No. 14/638,996, filed on Mar. 4, 2015, which is based on Japanese Patent Application No. 2014-059016 filed on Mar. 20, 2014 including the specification, drawings and abstract is incorporated herein by reference in its entirety.

BACKGROUND

The present invention relates to a semiconductor device, and for example, relates to a technique applicable to a semiconductor device having two circuits of different power supply voltages.

One of semiconductor devices incorporates a control circuit for generating a control signal of a power control element. In such a semiconductor device, a voltage applied to the power control element, that is, the power supply voltage of power to be controlled is higher than the power supply voltage of the control circuit. Accordingly, in order to input the control signal to the power control element, a second control circuit may be provided between the control circuit and the power control element. In general, the power supply voltage of the second control circuit is equal to or lower than the power supply voltage of the power control element, and is higher than the power supply voltage of the control circuit. In such a semiconductor device, it is necessary to separate the circuit of a high power supply voltage from the circuit of a low power supply voltage.

For example, Japanese Unexamined Patent Publication No. Hei 11(1999)-330456 (Patent Document 1) describes a technique of a separation structure for separating two circuits.

In Patent Document 1, a floating field plate formed of a polysilicon film surrounds an active region. Further, a metal electrode is provided so as to overlap with the polysilicon film. The metal electrode is coupled to the polysilicon film through a contact hole. A semi-insulating film is provided so as to cover the metal electrode.

Further, Japanese Unexamined Patent Publication No. 2010-80891 (Patent Document 2) and Japanese Unexamined Patent Publication No. Hei 4(1992)-332173 (Patent Document 3) describe the withstand voltage structure of a power MOSFET. In Patent Document 2, a field plate surrounds a drain region. Further, an interconnection line is provided so as to overlap with the field plate. The interconnection line is coupled to the field plate through a contact plug. In Patent Document 3, an insulating oxide film is provided between a high potential electrode and a base electrode. Further, a thin film resistive layer is provided over the insulating oxide film. The thin film resistive layer is spiral in plan view, and couples the high potential electrode and the base electrode.

SUMMARY

The present inventors have examined the provision of a transistor for coupling two circuits of different power supply potentials in a region having the separation structure to transfer the control signal between the circuits of different power supply potentials. At this time, the inventors have thought of surrounding the transistor by an impurity region to separate the transistor from the other circuits. However, in such a structure, the inventors have found the occurrence of a current leak in the impurity region surrounding the transistor. The other problems and novel features will become apparent from the description of this specification and the accompanying drawings.

According to one embodiment, a semiconductor device has a first circuit region and a second circuit region having a second circuit. The power supply voltage of the second circuit is lower than that of a first circuit. The first circuit region is surrounded by a separation region. The separation region has a field plate provided over an element separation film. The field plate is provided in a repetitive fashion along the edge of the first circuit region. Further, a transistor couples the second circuit to the first circuit. A second conductivity type region is provided around the transistor. The separation region has a plurality of conductive films provided over the field plate. Further, in a region where a portion, of the second conductivity type region, extending from a first circuit region side toward a second circuit region side and the element separation film overlap each other in plan view, the field plate and the conductive films are provided alternately from the first circuit region side toward the second circuit region side in plan view. Further, in this region, there is a decrease in the potential of the field plate and the potentials of the conductive films from the first circuit region toward the second circuit region. Further, at least one of the conductive films has a potential lower than the potential of the field plate adjacent to the conductive film on the second circuit region side in plan view. Further, this conductive film covers at least a part of the second conductivity type region without space in the extension direction of the second conductivity type region.

According to the one embodiment, it is possible to prevent a current leak in the second conductivity type region.

DETAILED DESCRIPTION

Figure 1:
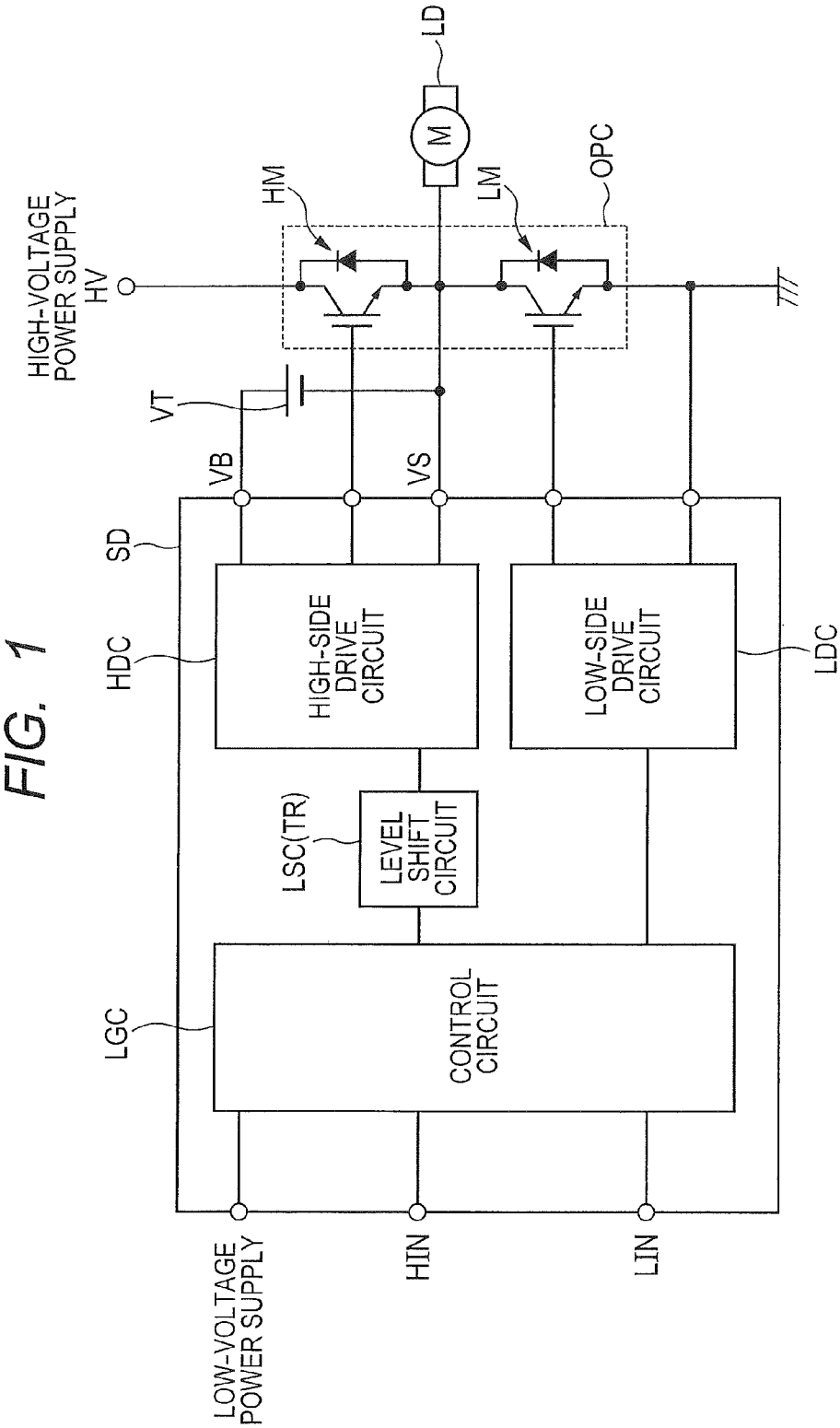
FIG. 1 is a functional block diagram of an electrical apparatus in which a semiconductor device according to a first embodiment is used.

Hereinafter, embodiments will be described with reference to the drawings. In all the drawings, the same components are denoted by the same reference numerals, and their description will be omitted as appropriate.

First Embodiment

FIG. 1 is a functional block diagram of an electrical apparatus in which a semiconductor device SD according to the first embodiment is used. The semiconductor device SD according to this embodiment is a device for applying a control signal to a power control circuit OPC. The power control circuit OPC controls power inputted to a load LD such as a motor.

In the example shown in FIG. 1, the power control circuit OPC includes a high-side MOS transistor HM and a low-side MOS transistor LM. The high-side MOS transistor HM and the low-side MOS transistor LM are, for example, planer-type high-voltage MOS transistors, vertical MOS transistors, bipolar transistors, or IGBTs (Insulated Gate Bipolar Transistors). Further, while the number of high-side MOS transistors HM is one in the example shown in FIG. 1, a plurality of high-side MOS transistors HM my be provided. Similarly, while the number of low-side MOS transistors LM is one in the example shown in FIG. 1, a plurality of low-side MOS transistors LM my be provided.

The semiconductor device SD includes a control circuit LGC (second circuit), a level shift circuit LSC, a high-side drive circuit HDC (first circuit), and a low-side drive circuit LDC. The control circuit LGC is a logic circuit and generates a control signal for controlling the load LD in accordance with an external input signal. This control signal includes a signal for controlling the low-side drive circuit LDC and a signal for controlling the high-side drive circuit HDC. A voltage (first voltage) is applied to the high-side drive circuit HDC from a power supply VT.

The power supply voltage of the low-side drive circuit LDC is roughly the same as the power supply voltage of the control circuit LGC. Accordingly, the control circuit LGC is coupled to the low-side drive circuit LDC without passing through a level shift circuit. On the other hand, the power supply voltage (first voltage) of the high-side drive circuit HDC is larger than the power supply voltage (second voltage) of the control circuit LGC. Accordingly, the control circuit LGC is coupled to the high-side drive circuit HDC through the level shift circuit LSC. The level shift circuit LSC includes a transistor TR described later.

Figure 2:
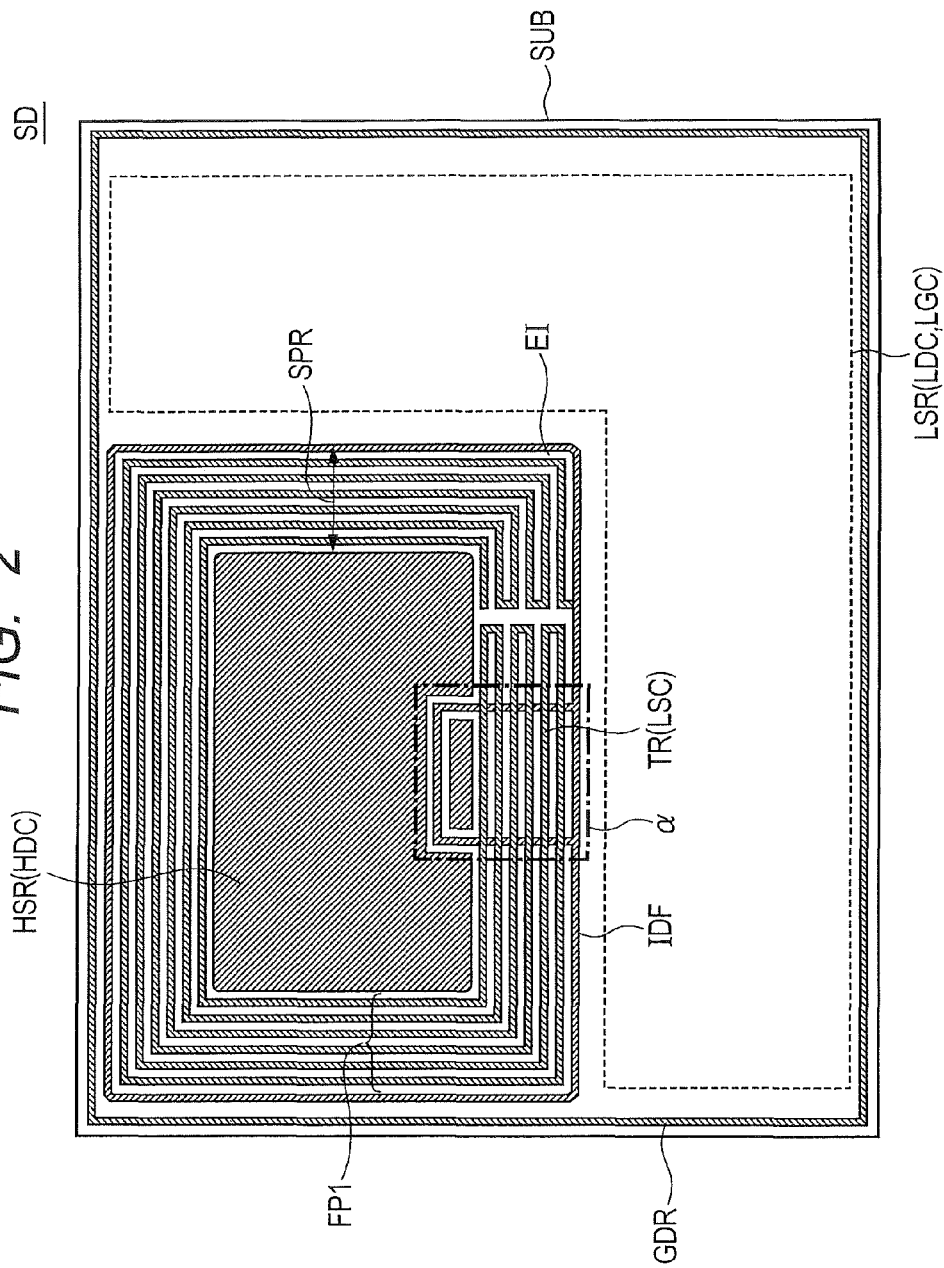
FIG. 2 is a plan view showing the configuration of the semiconductor device according to the first embodiment.

FIG. 2 is a plan view showing the configuration of the semiconductor device SD according to this embodiment. The semiconductor device SD has a first circuit region HSR, a separation region SPR, a second circuit region LSR, and the transistor TR within a region surrounded by a guard ring GDR.

The first circuit region HSR has the high-side drive circuit HDC, and the second circuit region LSR has the low-side drive circuit LDC and the control circuit LGC. The power supply voltage of the low-side drive circuit LDC and the power supply voltage (second voltage) of the control circuit LGC are lower than the power supply voltage (first voltage) of the first circuit region HSR.

The first circuit region HSR is surrounded by the separation region SPR. That is, the first circuit region HSR is separated from the second circuit region LSR by the separation region SPR. With this, circuits having different power supply potentials can be formed in one substrate SUB.

In the example shown in FIG. 2, the substrate SUB and the first circuit region HSR are roughly rectangular. The first circuit region HSR is disposed close to one corner of the substrate SUB. Further, no other circuits are disposed between one long side (upper side in the example shown in FIG. 2) and one short side (left side in the example shown in FIG. 2) of the first circuit region HSR and sides, of the substrate SUB, closest to these sides.

The transistor TR is located in the separation region SPR, and couples the control circuit LGC to the high-side drive circuit HDC. More specifically, the control circuit LGC is coupled to a gate electrode GE (described later) of the transistor TR, and the high-side drive circuit HDC is coupled to a drain DR (described later) of the transistor TR.

The conductivity type of the drain and source of the transistor TR is assumed to be a first conductivity type (e.g., n type). Further, a portion located in the separation region SPR and portions located in the first circuit region HSR and the second circuit region LSR in the substrate SUB are also of the first conductivity type.

The separation region SPR has an element separation film EI and a field plate FP1 (first field plate).

The element separation film EI surrounds the first circuit region HSR. The element separation film EI is formed using a LOCOS oxidation method, for example. However, the element separation film EI may be formed using an STI method.

The field plate FP1 overlaps with the element separation film EI in plan view, and is provided in a repetitive folded fashion along the edge of the first circuit region HSR. In the example shown in FIG. 2, field plates FP1 are nearly equally spaced. The field plate FP1 surrounds the first circuit region HSR except for the vicinity of fold points. The field plate FP1 is a resistive field plate electrode. The field plate FP1 is electrically coupled to the drain electrode DRE1 of the transistor TR at a portion located on the first circuit region HSR side from the center in the width direction X of the separation region SPR, and the ground potential or the power supply potential of the control circuit LGC (second circuit) is applied to the field plate FP1 at a portion located on the second circuit region LSR side from the center. However, the field plate FP1 may be electrically coupled to an electrode different from the drain electrode DRE1 in the first circuit region HSR. In this case, the voltage of the electrode coupled to the field plate FP1 is lower than the ground potential and the power supply potential of the control circuit LGC. In the following description, the ground potential is applied to the field plate FP1.

The field plate FP1 is preferably coupled to the drain electrode DRE1 of the transistor TR at the innermost periphery (on the first circuit region HSR side). Further, the ground potential is preferably applied to the field plate FP1 at the outermost periphery (on the second circuit region LSR side). This enables a potential gradient in most of the field plate FP1 in the extension direction of the field plate FP1, and consequently enhances the suppression of electric field concentration by the field plate FP1.

The transistor TR is provided between a long side of the first circuit region HSR and the second circuit region LSR. Further, the transistor TR is surrounded by a second conductivity type region IDF. The second conductivity type region IDF is a region formed by introducing impurities of the second conductivity type (e.g., p type) into the substrate SUB, and separates the transistor TR from the other regions. Further, the second conductivity type region IDF is provided at the outermost periphery of the separation region SPR so as to surround the field plate FP1. The element separation film EI is formed over most of the second conductivity type region IDF.

Figure 3:
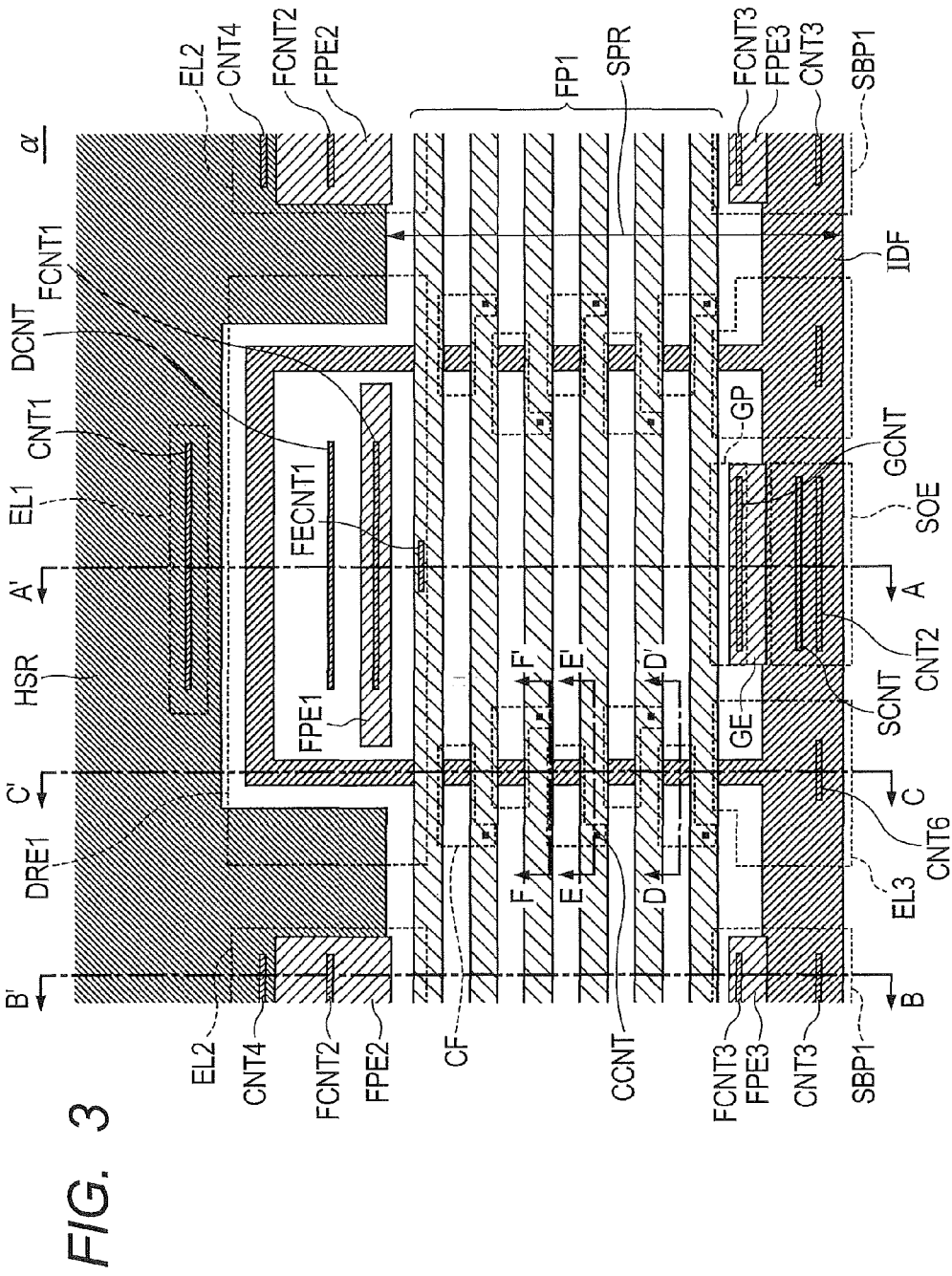
FIG. 3 is an enlarged view of a region enclosed by a dashed line α in FIG. 2.
Figure 4:
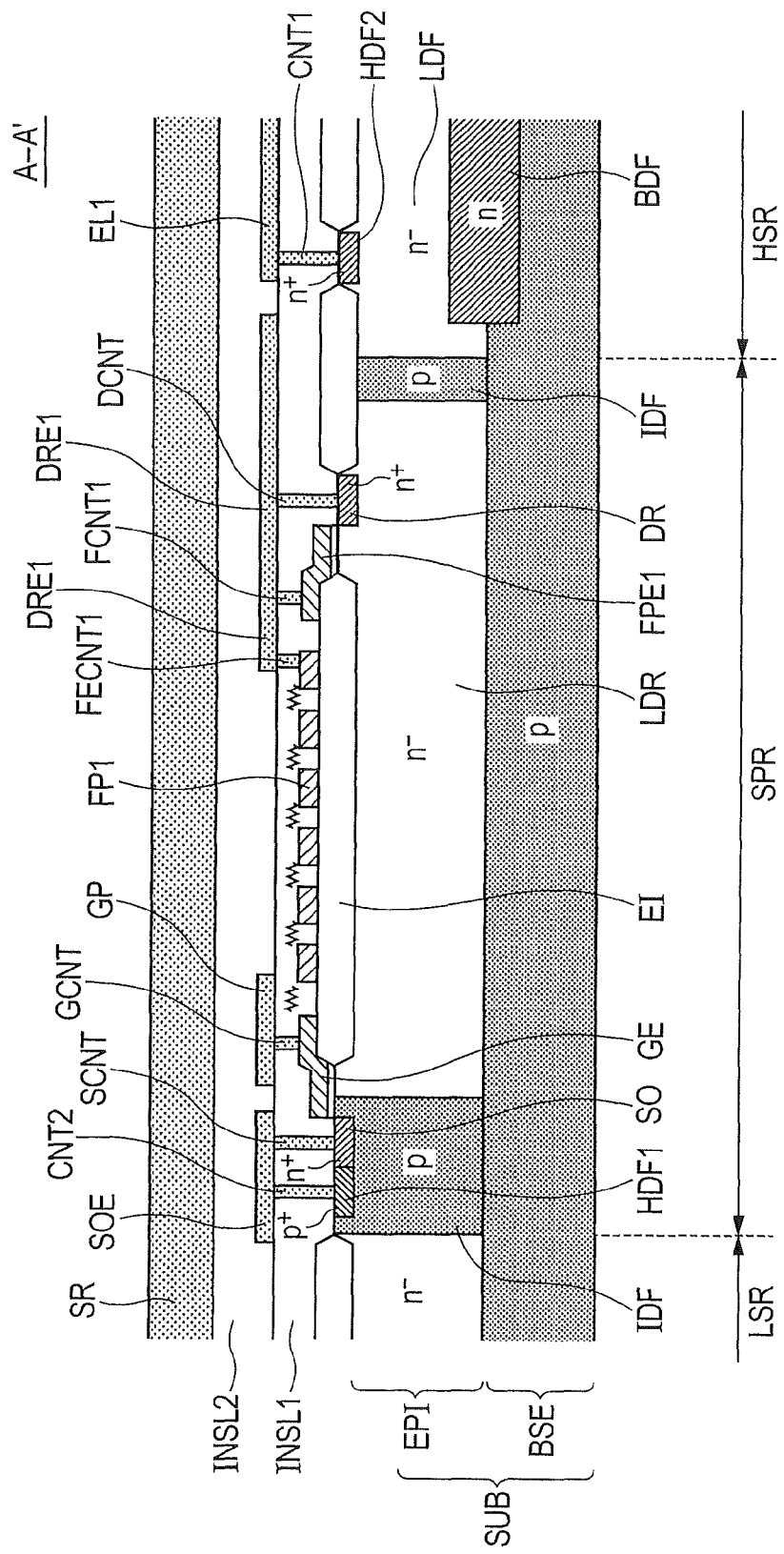
FIG. 4 is a sectional view taken along line A-A' of FIG. 3.

FIG. 3 is an enlarged view of a region enclosed by a dashed line α in FIG. 2, and is a plan view for explaining the configuration of the transistor TR and its surroundings. FIG. 4 is a sectional view taken along line A-A' of FIG. 3. In FIG. 3, the element separation film EI is omitted for convenience of explanation.

In this example, the substrate SUB is formed by epitaxially growing a semiconductor layer EPI (e.g., silicon layer) of the first conductivity type (e.g., n⁻ type) over a base substrate BSE (e.g., silicon substrate) of the second conductivity type (e.g., p type). Further, a buried diffusion layer BDF of the first conductivity type (e.g., n type) is formed in the first circuit region HSR of the substrate SUB. The buried diffusion layer BDF is provided from the top of the substrate BSE to the bottom of the semiconductor layer EPI in the thickness direction of the substrate SUB.

As described above, the transistor TR is surrounded by the second conductivity type region IDF. As shown in FIG. 4, the second conductivity type region IDF is formed throughout the semiconductor layer EPI in the depth direction. Accordingly, the lower end of the second conductivity type region IDF is coupled to the substrate BSE.

Further, as shown in FIG. 4, the source SO of the first conductivity type, the gate electrode GE, and the drain DR of the first conductivity type are arranged in the direction (e.g., orthogonal direction) that intersects an edge of the first circuit region HSR. More specifically, from the first circuit region HSR toward the second circuit region LSR, the drain DR, the gate electrode GE, and the source SO are arranged in this order.

In the example shown in FIG. 4, the transistor TR is a drain offset type transistor, and is formed using the semiconductor layer EPI.

More specifically, the element separation film EI is formed between the drain DR and the gate electrode GE. Part of the gate electrode GE is located over the element separation film EI. The source SO is formed in a portion, of the second conductivity type region IDF, located at the outer periphery of the separation region SPR. Further, a portion, of the semiconductor layer EPI, located under the element separation film EI (i.e., portion located between the drain DR and the gate electrode GE in plan view) is a drift region LDR of the first conductivity type (e.g., n⁻ type).

Further, the field plate FP1 is formed over the element separation film EI between the gate electrode GE and the drain DR. Further, the edge on the drain DR side of the element separation film EI is covered with a field plate electrode FPE1. The gate electrode GE, the field plate FP1, and the field plate electrode FPE1 are formed in the same process. Accordingly, these are formed of the same material (e.g., polysilicon). However, at least one of the gate electrode GE, the field plate FP1, and the field plate electrode FPE1 may be formed by a process different from the others.

As shown in FIGS. 3 and 4, the drain electrode DRE1, a source electrode SOE, and a gate plate electrode GP are formed over the substrate SUB. At least one interlayer insulator is formed between these electrodes and the substrate SUB. In the example shown in FIG. 4, an interlayer insulator INSL1 is formed between these electrodes and the substrate SUB. Further, an interlayer insulator INSL2 is formed over the interlayer insulator INSL1. Further, the above-described electrodes are covered with the interlayer insulator INSL2. Further, a sealing resin SR is provided over the interlayer insulator INSL2. The sealing resin SR is a resin (e.g., polyimide) for sealing the semiconductor device SD. The above-described electrodes are formed of a metal such as Al, and formed in the same process.

The drain electrode DRE1 is coupled to the drain DR through a contact DCNT, coupled to the field plate electrode FPE1 through a contact FCNT1, and coupled to the field plate FP1 through a contact FECNT1. In the example shown in FIG. 4, the contact FECNT1 is coupled to the innermost periphery (on the first circuit region HSR side) of the field plate FP1.

The gate plate electrode GP is coupled to the gate electrode GE through a contact GCNT. The source electrode SOE is coupled to the source SO through a contact SCNT. Further, the source electrode SOE is coupled through a contact CNT2 to a high density layer HDF1 of the second conductivity type formed in the second conductivity type region IDF. Accordingly, a source potential (e.g., ground potential) is applied to the second conductivity type region IDF.

Further, an electrode EL1 is formed in the same layer as the drain electrode DRE1. The electrode EL1 is coupled through a contact CNT1 to a high density layer HDF2 of the first conductivity type located in the first circuit region HSR. Accordingly, the power supply potential of the first circuit region HSR is applied through the electrode EL1 to a first conductivity type layer LDF (semiconductor layer EPI) located in the first circuit region HSR.

Figure 5:
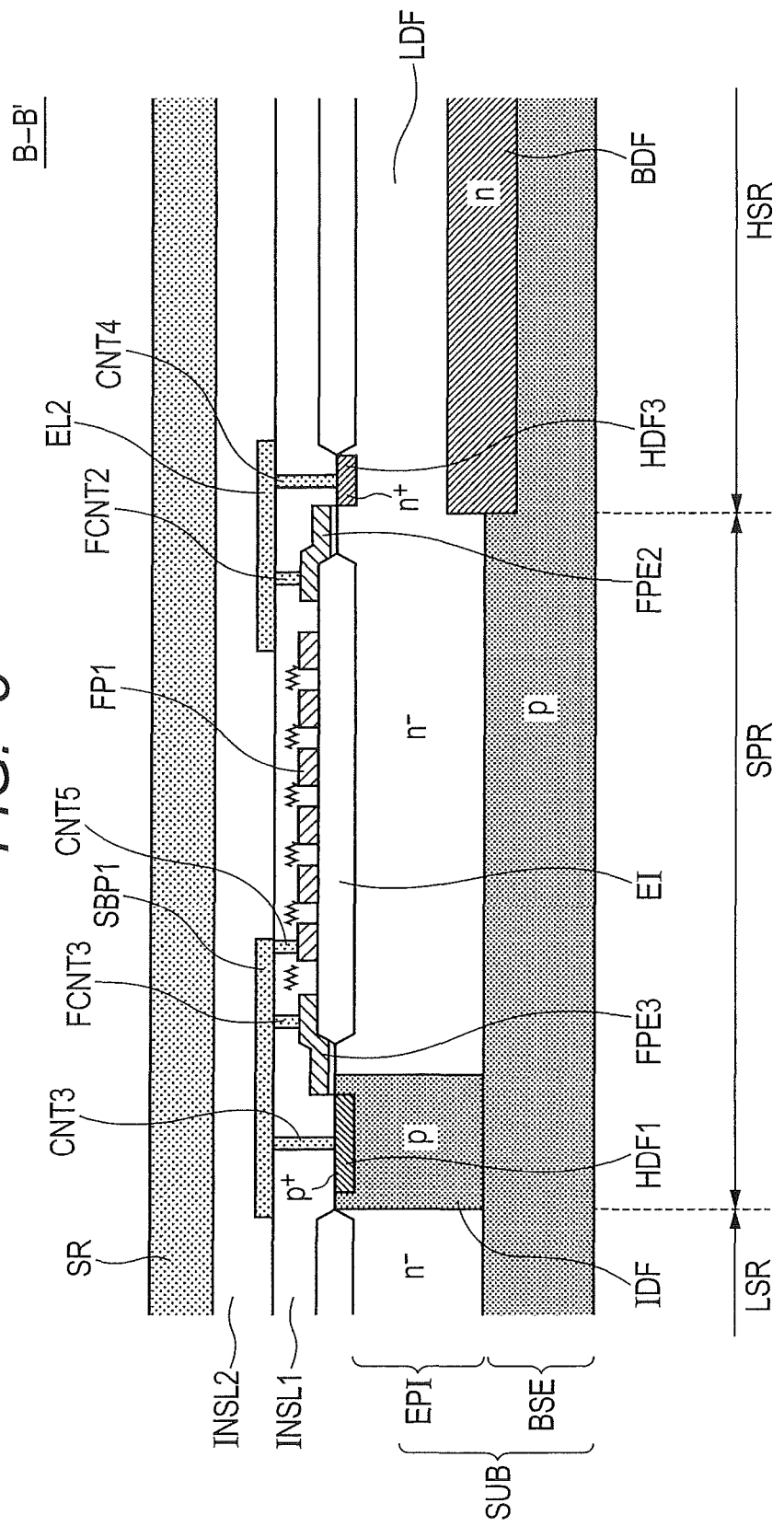
FIG. 5 is a sectional view taken along line B-B' of FIG. 3.

FIG. 5 is a sectional view taken along line B-B' of FIG. 3. As shown in FIGS. 5 and 3, field plate electrodes FPE2, FPE3 as well as the field plate electrode FPE1 are formed in a region where the transistor TR is not formed in the separation region SPR. The field plate electrodes FPE2, FPE3 have the same configuration as the field plate electrode FPE1 shown in FIG. 4. That is, the field plate electrode FPE2 covers the edge on the first circuit region HSR side of the element separation film EI, and the field plate electrode FPE3 covers the edge on the second circuit region LSR side of the element separation film EI.

The field plate electrode FPE2 is coupled to an electrode EL2 through a contact FCNT2, and the field plate electrode FPE3 is coupled to an electrode SBP1 through a contact FCNT3. The electrodes EL2, SBP1 are located in the same layer as the drain electrode DRE1 shown in FIG. 4, and formed in the same process as the drain electrode DRE1 and the like.

The ground potential is applied to the source electrode SOE (in FIG. 4) and the electrode SBP1 (in FIG. 5). Further, as shown in FIG. 5, the electrode SBP1 is coupled to the field plate FP1 through a contact CNT5. In the example shown in FIG. 5, the contact CNT5 is coupled to the outermost periphery on the second circuit region LSR side of the field plate FP1.

Further, as shown in FIG. 5, the electrode EL2 is coupled through a contact CNT4 to a high density layer HDF3 of the first conductivity type, and the electrode SBP1 is coupled through a contact CNT3 to the high density layer HDF1 of the second conductivity type. The high density layer HDF3 is provided on the surface of the first conductivity type layer LDF located in the first circuit region HSR.

Figure 6:
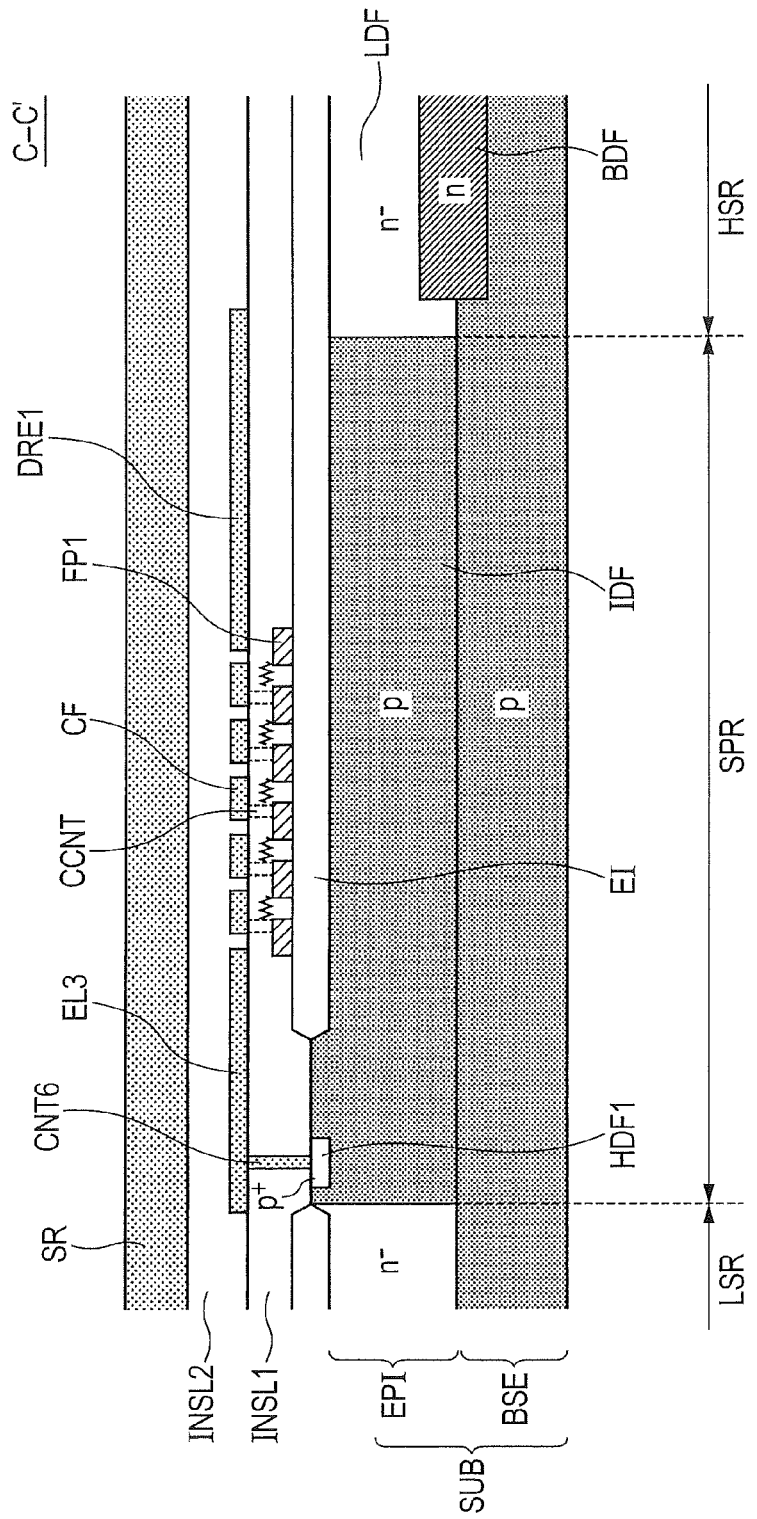
FIG. 6 is a sectional view taken along line C-C' of FIG. 3.

FIG. 6 is a sectional view taken along line C-C' of FIG. 3. As shown in FIG. 6, conductive films CF are provided over the field plate FP1 through the interlayer insulator INSL1. Further, as shown in FIGS. 6 and 3, in a region (hereinafter referred to as an "extension region") where a portion, of the second conductivity type region IDF, extending from the first circuit region HSR side toward the second circuit region LSR side and the element separation film overlap each other in plan view, the field plate FP1 and the conductive film CF are provided alternately from the first circuit region HSR side toward the second circuit region LSR side in plan view. In the example shown in FIGS. 6 and 3, in the extension region, the field plate FP1 and the conductive film CF cover the second conductivity type region IDF without space in plan view.

The conductive film CF is electrically coupled to the field plate FP1 through a contact CCNT (via) embedded in the interlayer insulator INSL1. In the example shown in FIG. 6, the conductive film CF is electrically coupled to the field plate FP1 adjacent to the conductive film CF in plan view.

In such a structure, the potential of the field plate FP1 is provided to the conductive film CF. As described above, in this example, the voltage of the drain electrode DRE1 is applied to the innermost field plate FP1 on the first circuit region HSR side. Further, the ground potential is applied to the outermost field plate FP1 on the second circuit region LSR side. Further, the field plate FP1 is a resistive field plate. Accordingly, there is a decrease in the potential of the field plate FP1 from the first circuit region HSR (high potential side) toward the second circuit region LSR (low potential side). Therefore, between the innermost field plate FP1 and the outermost field plate FP1, the potential of the conductive film CF is equal to or higher than the ground potential and is equal to or lower than the voltage of the drain electrode DRE1. Further, there is a decrease in the potential of the conductive film CF from the first circuit region HSR (high potential side) toward the second circuit region LSR (low potential side).

In the example shown in FIG. 6, the conductive film CF is electrically coupled to the field plate FP1 adjacent to the conductive film CF on the second circuit region LSR side in plan view. In this case, the potential of the conductive film CF is equal to the potential of the field plate FP1 adjacent to the conductive film CF on the second circuit region LSR side in plan view. The conductive film CF may be electrically coupled to the field plate FP1 located further on the second circuit region LSR side than the field plate FP1 adjacent to the conductive film CF on the second circuit region LSR side in plan view. In this case, the potential of the conductive film CF is lower than the potential of the field plate FP1 adjacent to the conductive film CF on the second circuit region LSR side in plan view. Further, some conductive films CF may be electrically coupled to the field plate FP1 adjacent to the conductive film CF on the first circuit region HSR side in plan view.

In the example shown in FIG. 3, the planar shape of the conductive film CF includes a first region extending along the field plate FP1 and a second region extending in the direction of intersecting the field plate FP1 from a part of the first region (e.g., one end of the first region). More specifically, the planar shape of the conductive film CF is shaped like a letter L. In the first region, the conductive film CF overlaps with the second conductivity type region IDF in plan view. In the second region, the conductive film CF is coupled to the contact CCNT.

Further, in the example shown in FIGS. 6 and 3, the second regions of the conductive films CF protrude from the first region in the direction from the first circuit region HSR toward the second circuit region LSR. Further, the second regions are arranged in a staggered configuration between opposed regions across the second conductivity type region IDF. That is, the contacts CCNT of the conductive films CF are arranged in a staggered configuration between opposed regions across the second conductivity type region IDF. This enables the contacts CCNT to be arranged in an efficient manner.

The conductive film CF is formed in the same layer (interlayer insulator INSL2) as the drain electrode DRE1 and the like shown in FIG. 4. Further, as shown in FIG. 6, an electrode EL3 is provided in the same layer as the conductive film CF. The electrode EL3 is coupled through a contact CNT6 to the high density layer HDF1 of the second conductivity type. The conductive film CF and the electrode EL3 are formed of a metal such as Al, and formed in the same process as the drain electrode DRE1 and the like shown in FIG. 4.

Figure 7:
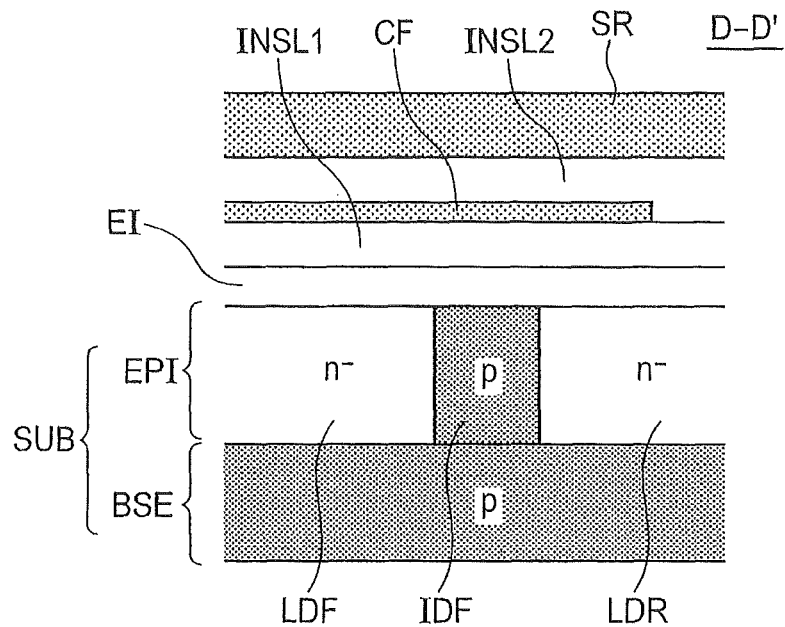
FIG. 7 is a sectional view taken along line D-D' of FIG. 3.

FIG. 7 is a sectional view taken along line D-D' of FIG. 3. In the example shown in FIG. 7, the first region of the conductive film CF extends along the edge of the first circuit region HSR (see FIG. 3) from the inside of the transistor TR (drift region LDR side) toward the outside of the transistor TR (first conductivity type layer LDF side). Further, in the example shown in FIG. 7, the conductive film CF covers the whole of the second conductivity type region IDF in the width direction of the second conductivity type region IDF.

Figure 8:
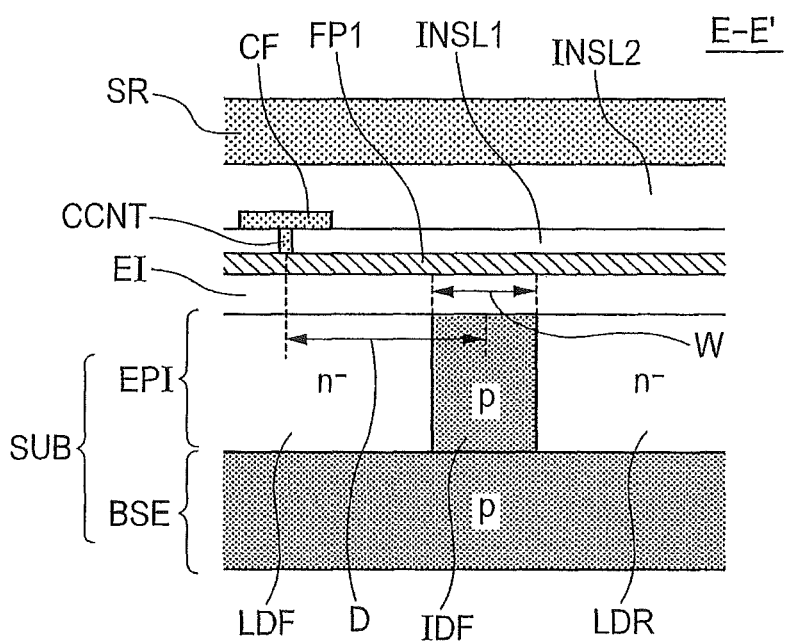
FIG. 8 is a sectional view taken along line E-E' of FIG. 3.

FIG. 8 is a sectional view taken along line E-E' of FIG. 3. In the example shown in FIG. 8, the second region of the conductive film CF is electrically coupled to the field plate FP1 through the contact CCNT on the outside of the transistor TR (first conductivity type layer LDF side). Although not restricted, the distance D between the second conductivity type region IDF and the contact CCNT may be less than 10 times the width W of the second conductivity type region IDF, for example. In the case where the distance D is too large, the voltage drop between the conductive film CF and the field plate FP1 is large. On the other hand, in the case where the distance D is less than 10 times the width W, the voltage drop can be small.

Figure 9:
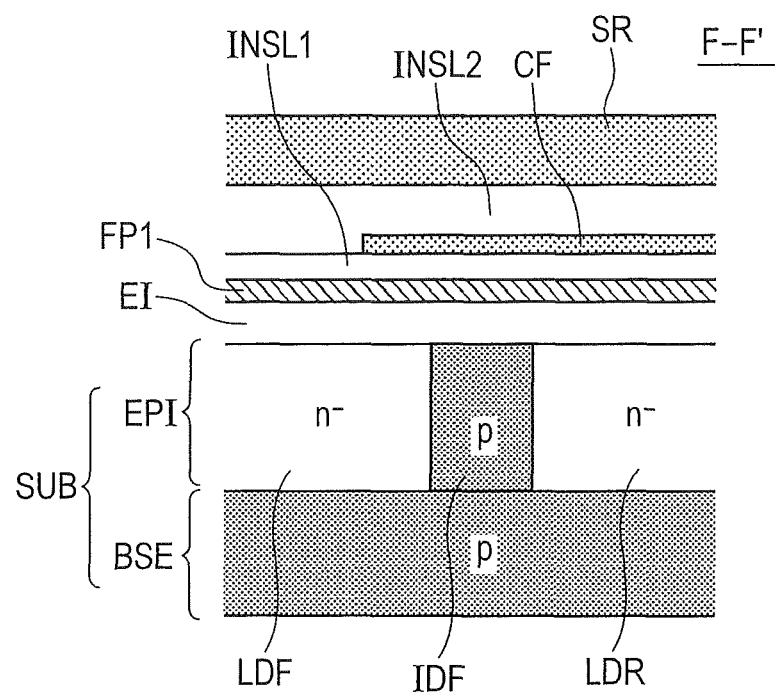
FIG. 9 is a sectional view taken along line F-F' of FIG. 3.

FIG. 9 is a sectional view taken along line F-F' of FIG. 3. In the example shown in FIG. 9, the first region of the conductive film CF extends along the edge of the first circuit region HSR (see FIG. 3) from the inside of the transistor TR (drift region LDR side) toward the outside of the transistor TR (first conductivity type layer LDF side). Further, in the example shown in FIG. 9, the conductive film CF covers the whole of the second conductivity type region IDF in the width direction of the second conductivity type region IDF, as in the example shown in FIG. 7.

Next, the operation and effect of this embodiment will be described. In this embodiment, the potential of the conductive film CF is equal to or lower than the potential of the field plate FP1 adjacent to the conductive film CF on the second circuit region LSR side in plan view. The potential of the surface of the element separation film EI between two adjacent field plates FP1 in the extension region is a value between the potentials of the two field plates FP1. Therefore, the potential of the conductive film CF is lower than the potential of the surface of the element separation film EI. That is, in the region covered with the conductive film CF, a positive voltage is not applied to the element separation film EI.

This structure prevents the operation of a parasitic transistor in the extension region and its surroundings. More specifically, in the extension region, the second conductivity type region IDF is sandwiched between the first conductivity type layer LDF and the drift region LDR of the first conductivity type. Further, the second conductivity type region IDF is covered with the element separation film EI. Accordingly, the second conductivity type region IDF, the first conductivity type layer LDF, the drift region LDR, and the element separation film EI might form a parasitic transistor. On the other hand, in this embodiment, the positive voltage is not applied to the element separation film EI in the region covered with the conductive film CF, as described above. This prevents the parasitic transistor from operating. Consequently, it is possible to prevent a current leak between the first conductivity type layer LDF (first circuit region HSR) and the drift region LDR (transistor TR) through the second conductivity type region IDF.

The above-described effect functions effectively particularly in the case where the sealing resin SR covers the semiconductor device SD. In general, the sealing resin SR contains positive mobile ions (e.g., $Na^+$ ions). Such positive mobile ions are easily diffused by heat. If a voltage is generated between the first circuit region HSR and the second circuit region LSR at high temperature, the mobile ions move, causing polarization. Further, the polarization might generate a downward electric field which might turn on the parasitic transistor. In this embodiment, it is possible to effectively prevent the operation of the parasitic transistor.

Figure 10A:
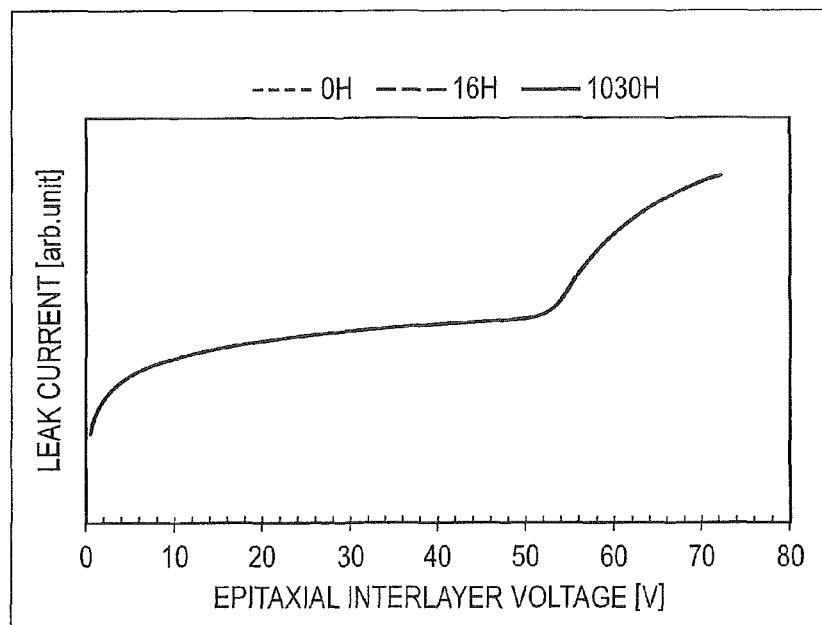
FIGS. 10A and 10B are graphs showing the results of HTRB (High Temperature Reverse Bias) tests.
Figure 10B:
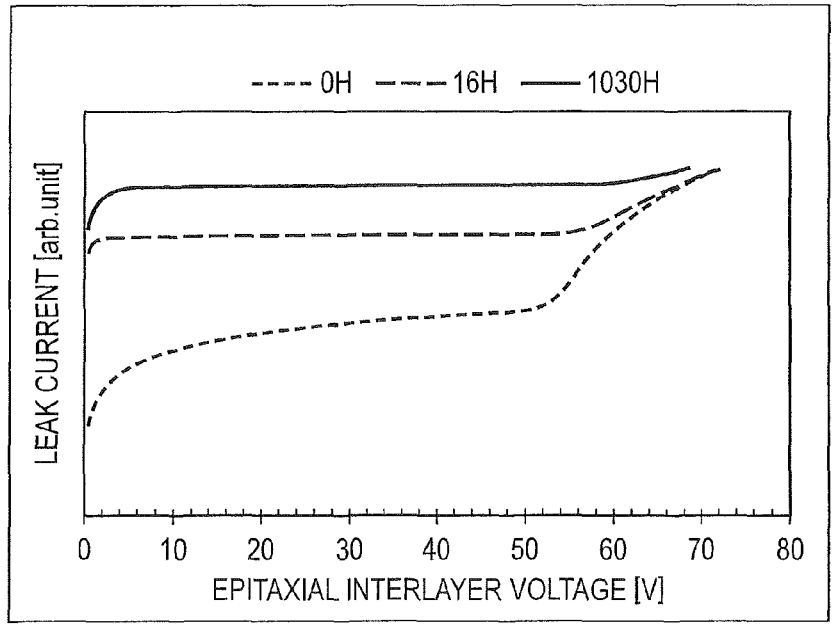

FIGS. 10A and 10B are graphs showing the results of HTRB (High Temperature Reverse Bias) tests. FIG. 10A shows the result of the semiconductor device SD according to this embodiment. FIG. 10B shows the result of a structure in which the conductive film CF is removed from the semiconductor device SD according to this embodiment. As shown in FIG. 10A, in this embodiment, even with an increase in HTRB test time, the withstand voltage of the second conductivity type region IDF hardly deteriorates between the first conductivity type layer LDF (first circuit region HSR) and the drift region LDR (transistor TR). On the other hand, as shown in FIG. 10B, in the case where the conductive film CF is not provided, the withstand voltage of the second conductivity type region IDF deteriorates with increasing time of the HTRB test.

Figure 11:
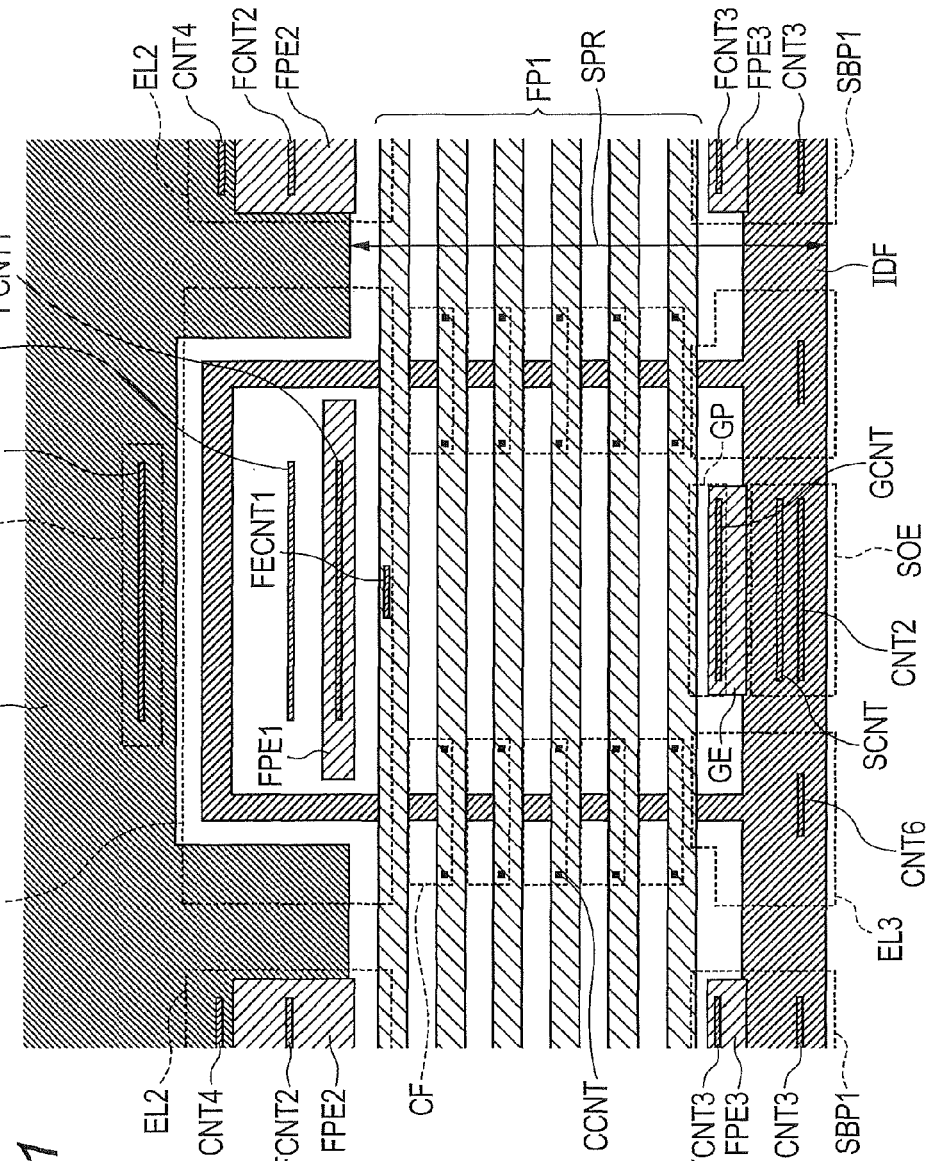
FIG. 11 is a view showing a modification of FIG. 3.

FIG. 11 is a view showing a modification of FIG. 3. The conductive film CF is electrically coupled to the field plate FP1 through contacts CCNT in a plurality of regions away from each other in plan view. In the example shown in FIG. 11, the conductive film CF is electrically coupled to the field plate FP1 through the contacts CCNT in the regions opposed to each other across the second conductivity type region IDF in plan view. Further, in the example shown in FIG. 11, the planar shape of the conductive film CF is rectangular.

In the example shown in FIG. 11 as well, the semiconductor device SD can obtain the same effect as in this embodiment. Further, in the example shown in FIG. 11, the conductive film CF can obtain the potential of the field plate FP1 from a plurality of regions. Therefore, the potential of the field plate FP1 can be reliably provided to the conductive film CF.

Figure 12:
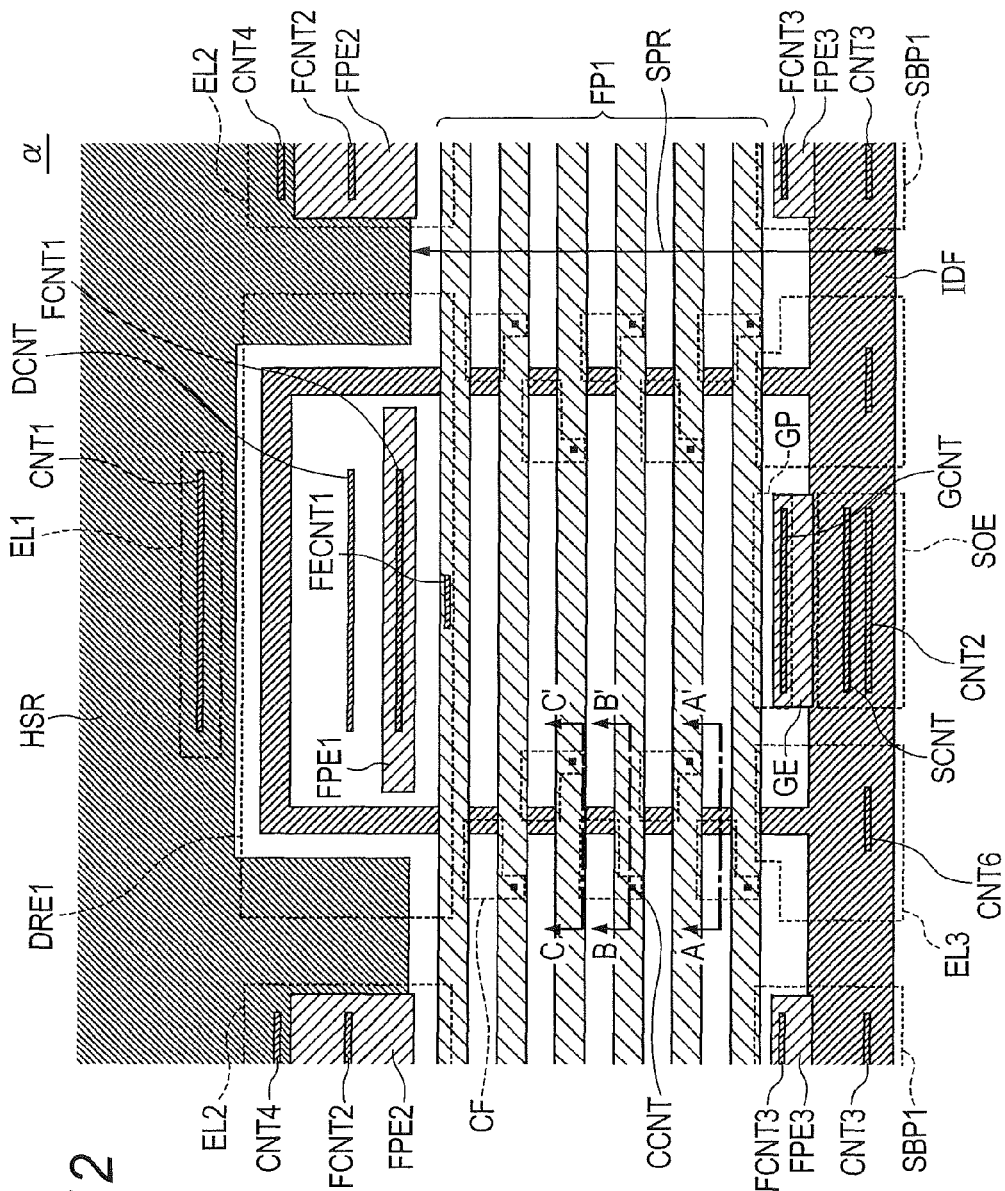
FIG. 12 is a view showing a modification of FIG. 3.
Figure 13:
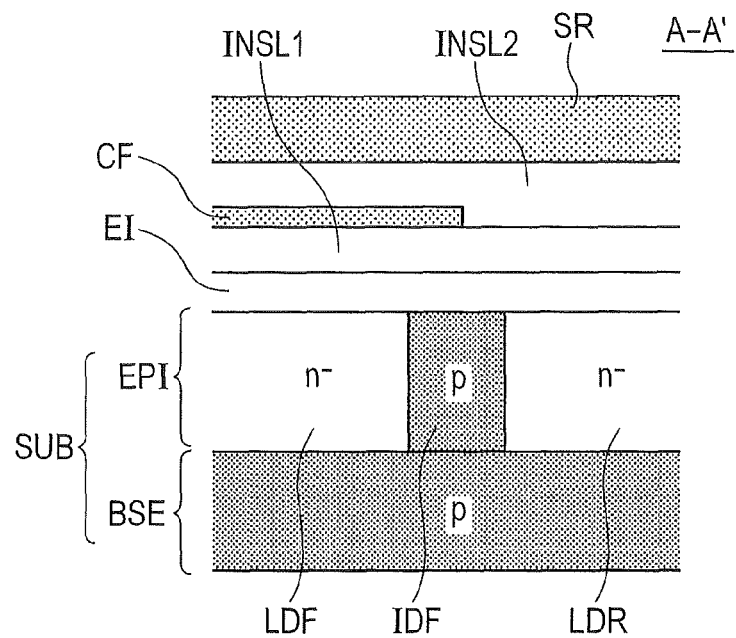
FIG. 13 is a sectional view taken along line A-A' of FIG. 12.
Figure 14:
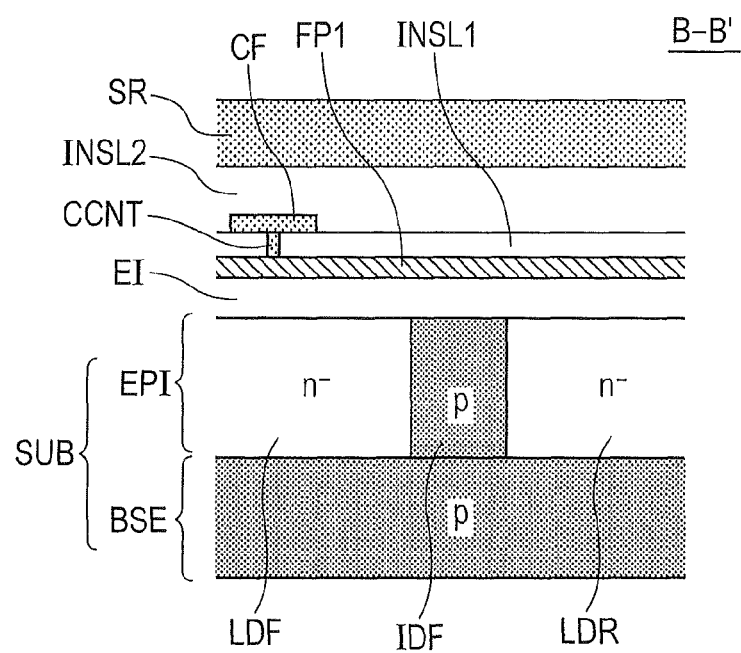
FIG. 14 is a sectional view taken along line B-B' of FIG. 12.
Figure 15:
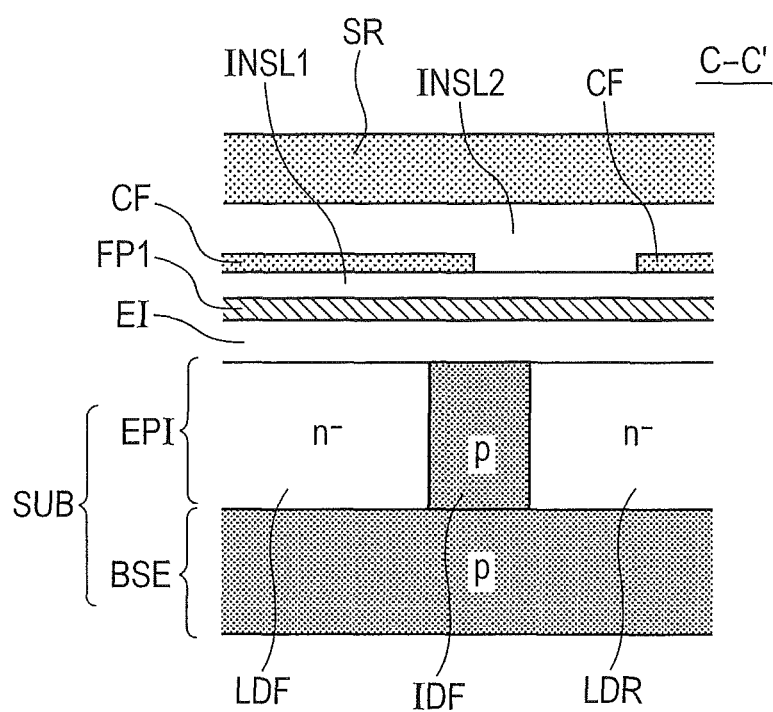
FIG. 15 is a sectional view taken along line C-C' of FIG. 12.

FIG. 12 is a view showing a modification of FIG. 3. FIGS. 13 to 15 are sectional views taken along lines A-A' to C-C' of FIG. 12, and correspond to FIGS. 7 to 9 of this embodiment. As described above, the planar shape of the conductive film CF includes the first region extending along the field plate FP1 and the second region extending in the direction of intersecting the field plate FP1 from one end of the first region. In the example shown in FIG. 12, the first region of the conductive film CF covers only a part of the second conductivity type region IDF in the width direction of the second conductivity type region IDF.

In the example shown in FIG. 12 as well, in a region where the second conductivity type region IDF overlaps with the conductive film CF in plan view, it is possible to prevent an inversion layer from being formed at the second conductivity type region IDF. Therefore, even if an inversion layer is formed at the second conductivity type region IDF in a region where the second conductivity type region IDF does not overlap with either the conductive film CF or the field plate FP1, it is possible to prevent a current leak passing through the second conductivity type region IDF. Thus, in the example shown in FIG. 12 as well, the semiconductor device SD can obtain the same effect as in this embodiment.

Figure 16:
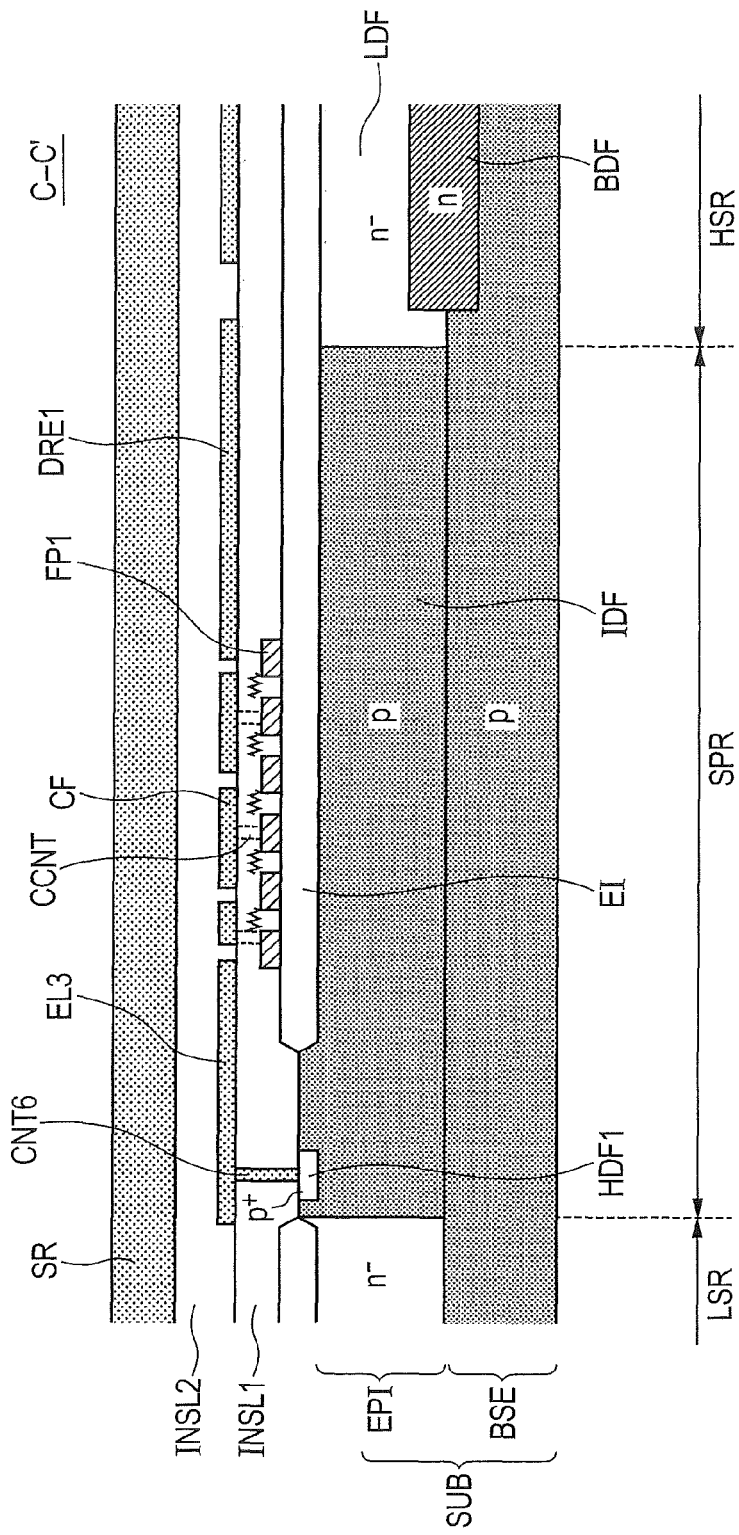
FIG. 16 is a view showing a modification of FIG. 6.

FIG. 16 is a view showing a modification of FIG. 6. In the example shown in FIG. 16, some conductive films CF adjacent to each other in this embodiment are coupled to each other. More specifically, in the example shown in FIG. 16, two conductive films CF adjacent to each other in this embodiment are coupled to each other. However, the number of conductive films CF adjacent to each other is not limited to two, and may be three or more.

The conductive films CF adjacent to each other are electrically coupled through the contact CCNT to the field plate FP1 covered with the conductive film CF in plan view. Further, the conductive film CF covers at least a part of the second conductivity type region IDF between the field plate FP1 coupled to the conductive film CF and an adjacent field plate FP1 on the first circuit region HSR side (high potential side) without space in the extension direction of the second conductivity type region IDF.

In the example shown in FIG. 16, in the region between the field plates FP1, the positive voltage is not applied to the element separation film EI. Thus, in the example shown in FIG. 16 as well, the semiconductor device SD can obtain the same effect as in this embodiment.

Second Embodiment

Figure 17:
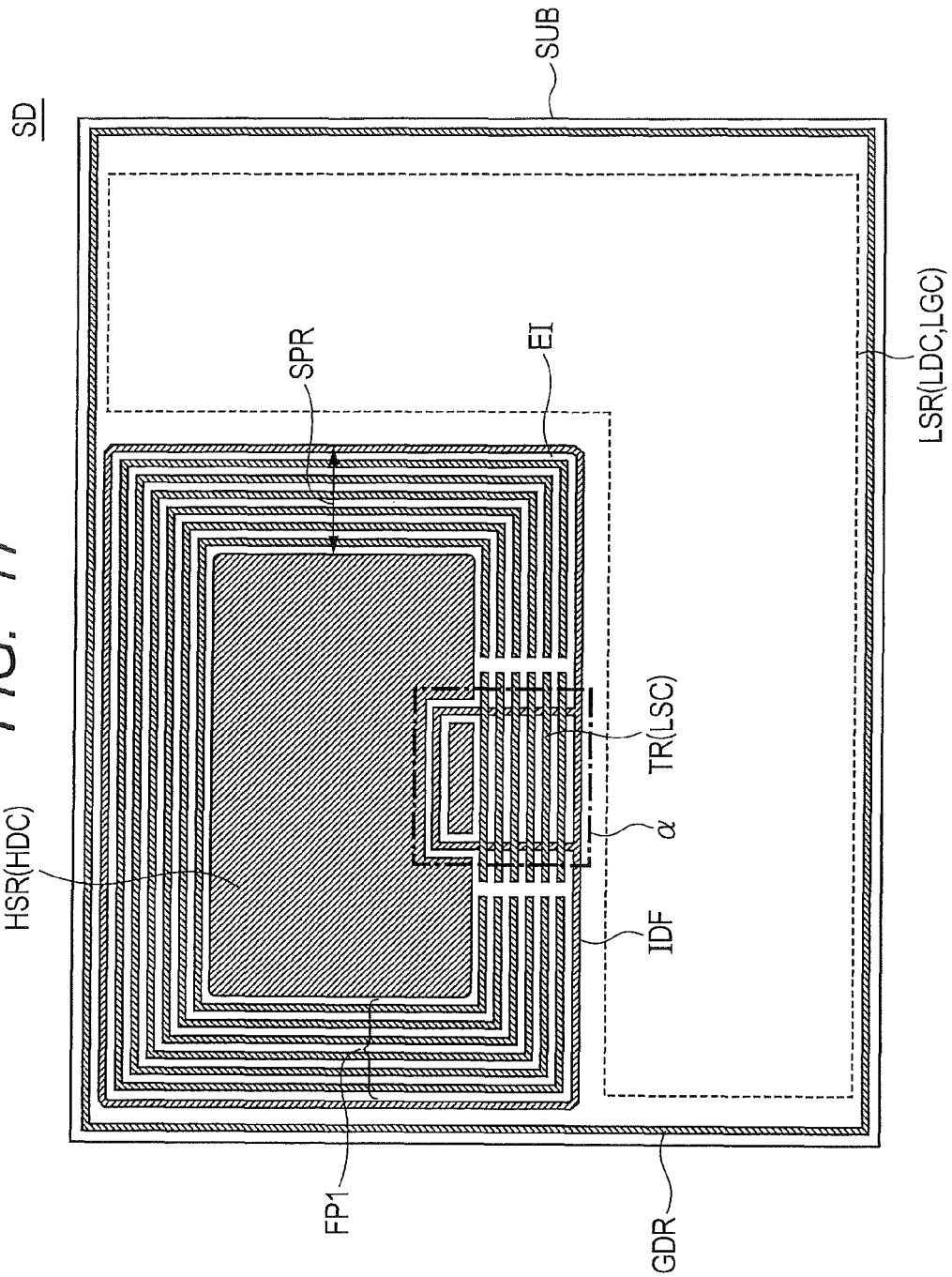
FIG. 17 is a plan view showing the configuration of a semiconductor device according to a second embodiment.

FIG. 17 is a plan view showing the configuration of a semiconductor device SD according to the second embodiment, and corresponds to FIG. 2 of the first embodiment. The semiconductor device SD according to this embodiment has the same configuration as that of the first embodiment except for the following points.

In this embodiment, the field plate FP1 is provided in a repetitive fashion along the edge of the first circuit region HSR, as in the first embodiment. However, in this embodiment, adjacent field plates FP1 are electrically floating to each other. That is, the field plates FP1 according to this embodiment are floating field plates.

Further, the field plates FP1 are provided with different potentials. More specifically, as in the first embodiment, there is a decrease in the potentials of the field plates FP1 from the first circuit region HSR toward the second circuit region LSR.

In this embodiment as well, in the region covered with the conductive film CF, the positive voltage is not applied to the element separation film EI. Therefore, in this embodiment as well, the semiconductor device SD can obtain the same effect as in the first embodiment.

Third Embodiment

Figure 18:
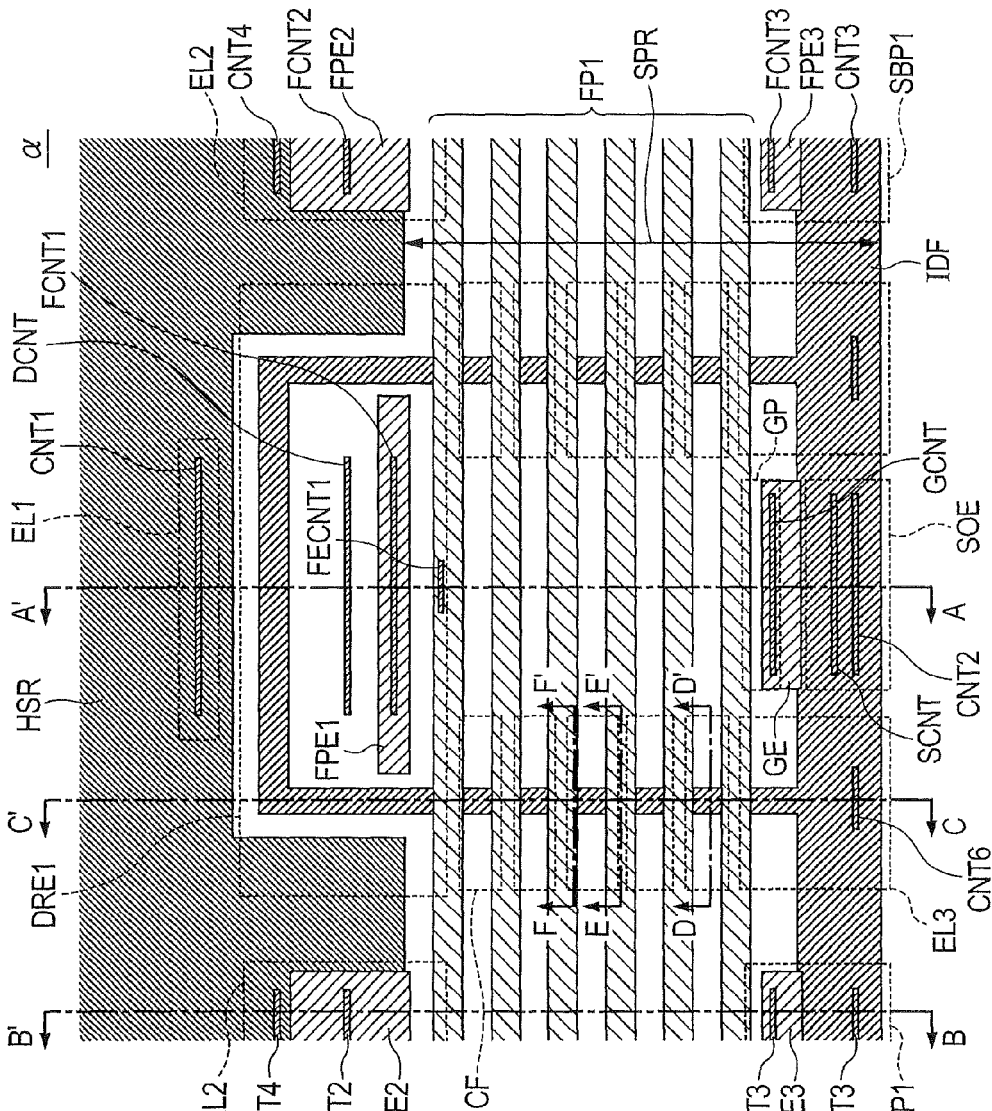
FIG. 18 is an enlarged view of a portion of a plan view showing the configuration of a semiconductor device according to a third embodiment.
Figure 19:
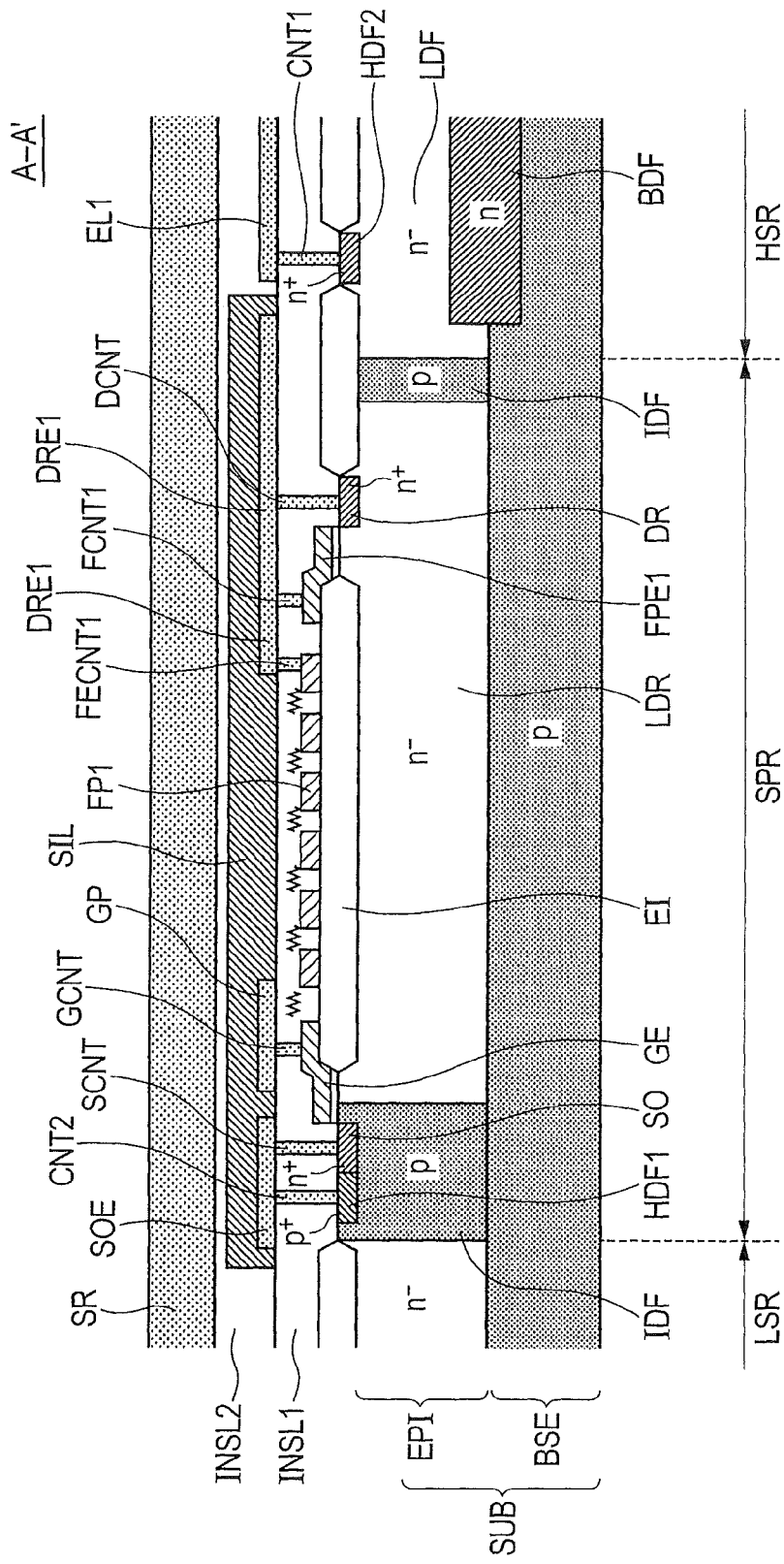
FIG. 19 is a sectional view taken along line A-A' of FIG. 18.
Figure 20:
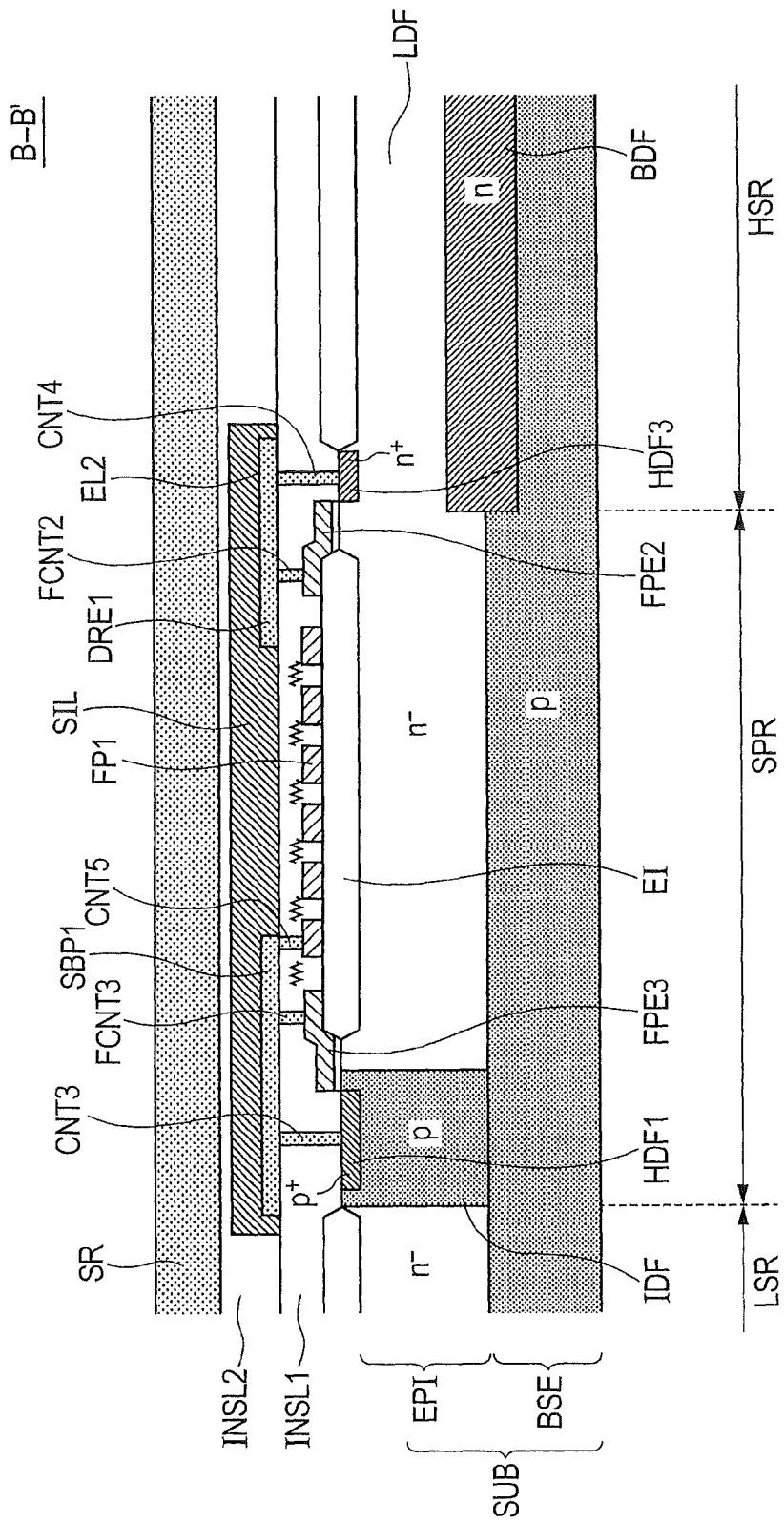
FIG. 20 is a sectional view taken along line B-B' of FIG. 18.

FIG. 18 is an enlarged view of a portion of a plan view showing the configuration of a semiconductor device SD according to the third embodiment, and corresponds to FIG. 3 of the first embodiment. FIGS. 19 to 24 are sectional views taken along lines A-A' to F-F' of FIG. 18, and correspond to FIGS. 4 to 9 of the first embodiment. The semiconductor device SD according to this embodiment has the same configuration as that of the first embodiment except for the following points.

In this embodiment, a semi-insulating film SIL covers the separation region SPR. More specifically, the semi-insulating film SIL may cover the entire surface of the separation region SPR. The semi-insulating film SIL is provided over the interlayer insulator INSL1, and covered with the interlayer insulator INSL2. For example, a silicon oxide film containing much silicon can be used as the semi-insulating film SIL.

The semi-insulating film SIL covers the conductive film CF, the source electrode SOE, the gate plate electrode GP, the drain electrode DRE1, the electrode SBP1, the electrode EL2, and the electrode EL3. That is, these electrodes are electrically coupled to the semi-insulating film SIL.

In this embodiment, the contact CCNT in the first embodiment is not provided. Therefore, the conductive film CF and the field plate FP1 are not electrically coupled together through the contact CCNT. Further, the conductive films CF are spaced apart from each other.

Figure 21:
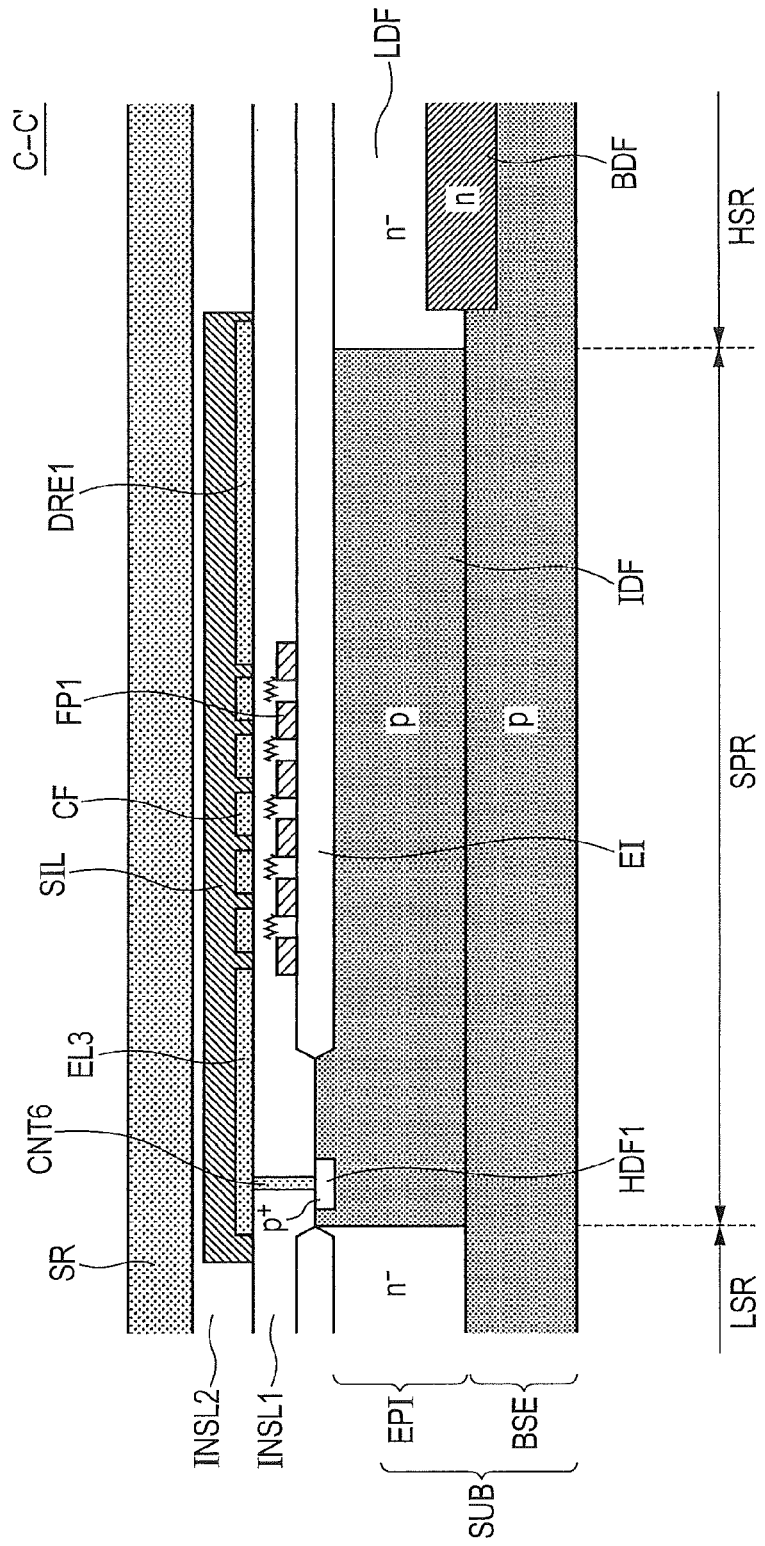
FIG. 21 is a sectional view taken along line C-C' of FIG. 18.
Figure 22:
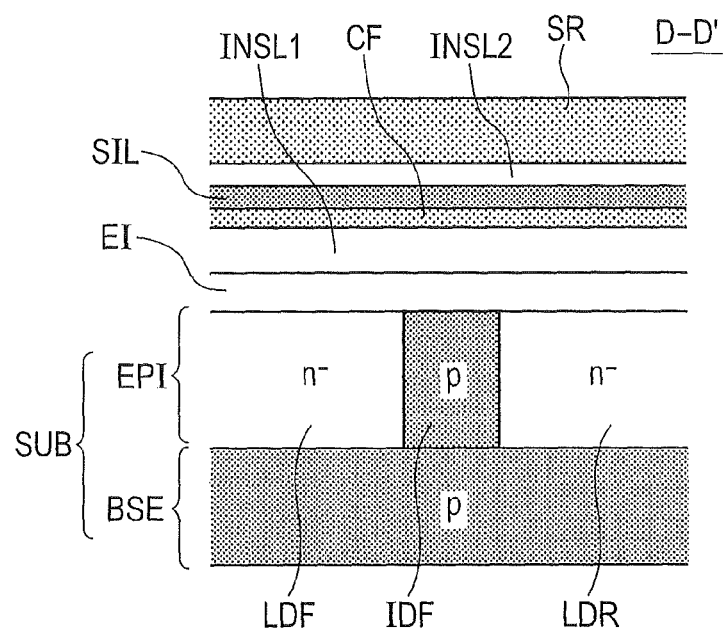
FIG. 22 is a sectional view taken along line D-D' of FIG. 18.
Figure 23:
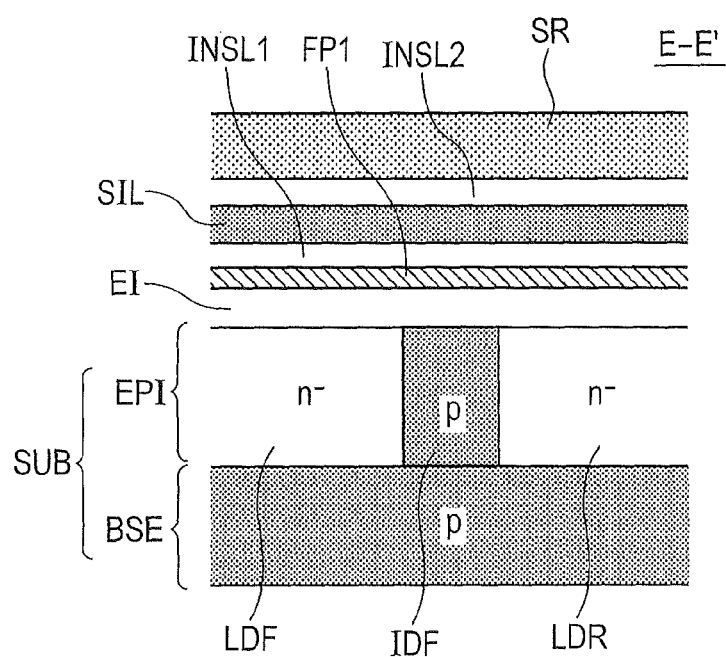
FIG. 23 is a sectional view taken along line E-E' of FIG. 18.
Figure 24:
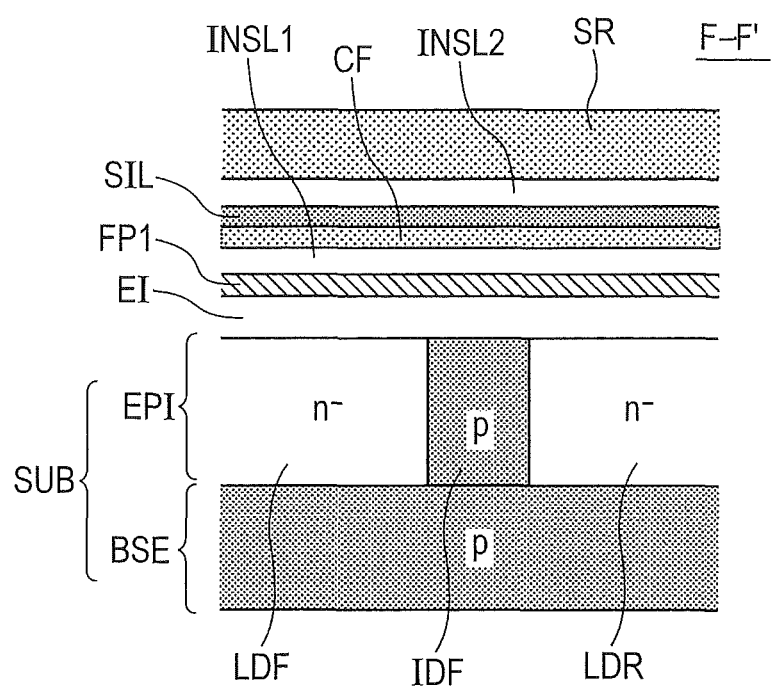
FIG. 24 is a sectional view taken along line F-F' of FIG. 18.

In this embodiment, adjacent conductive films CF in the extension region are electrically coupled together through the semi-insulating film SIL. Further, as shown in FIGS. 18 and 21, from the first circuit region HSR toward the second circuit region LSR, the drain electrode DRE1, the conductive film CF, and the electrode EL3 are arranged in this order. Accordingly, there is a decrease in the potentials of the conductive films CF between the potential of the drain electrode DRE1 and the potential of the electrode EL3, from the first circuit region HSR toward the second circuit region LSR.

Further, by appropriately selecting the space between the conductive films CF or the resistance value of the semi-insulating film SIL, the potential of the conductive film CF can be equal to or lower than the potential of the field plate FP1 adjacent to the conductive film CF on the second circuit region LSR side in plan view, as in the first embodiment.

In this embodiment as well, the semiconductor device SD can obtain the same effect as in the first embodiment. Further, in this embodiment, it is not necessary to couple the conductive film CF and the field plate FP1 together through the contact CCNT. Accordingly, the width of the field plate FP1 can be smaller than the contact CCNT. This can increase the total length of the field plate FP1, and consequently can increase the resistance of the field plate FP1. Thus, it is possible to suppress a leak current from the first circuit region HSR to the second circuit region LSR.

Fourth Embodiment

Figure 25:
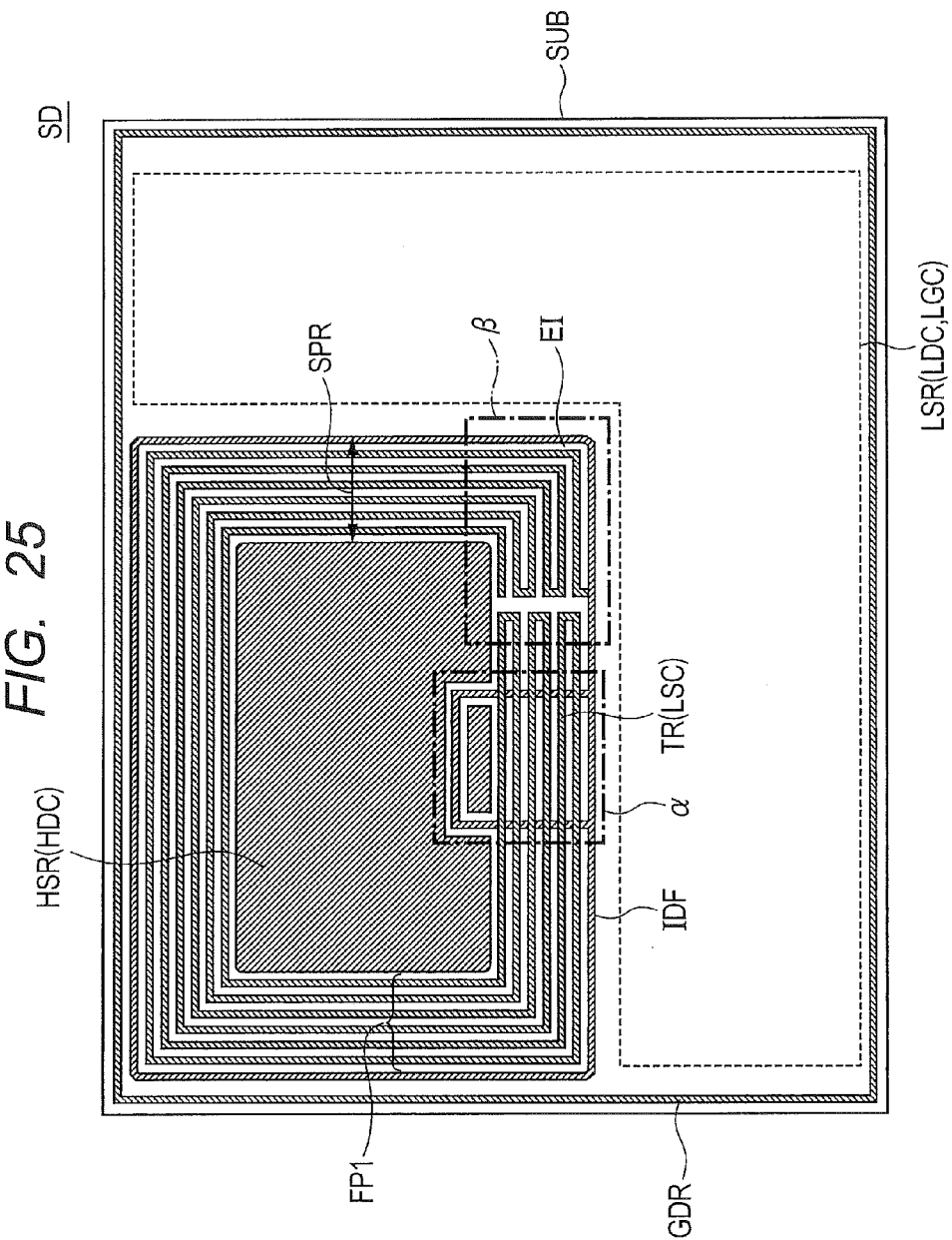
FIG. 25 is a plan view showing the configuration of a semiconductor device according to a fourth embodiment.
Figure 26:
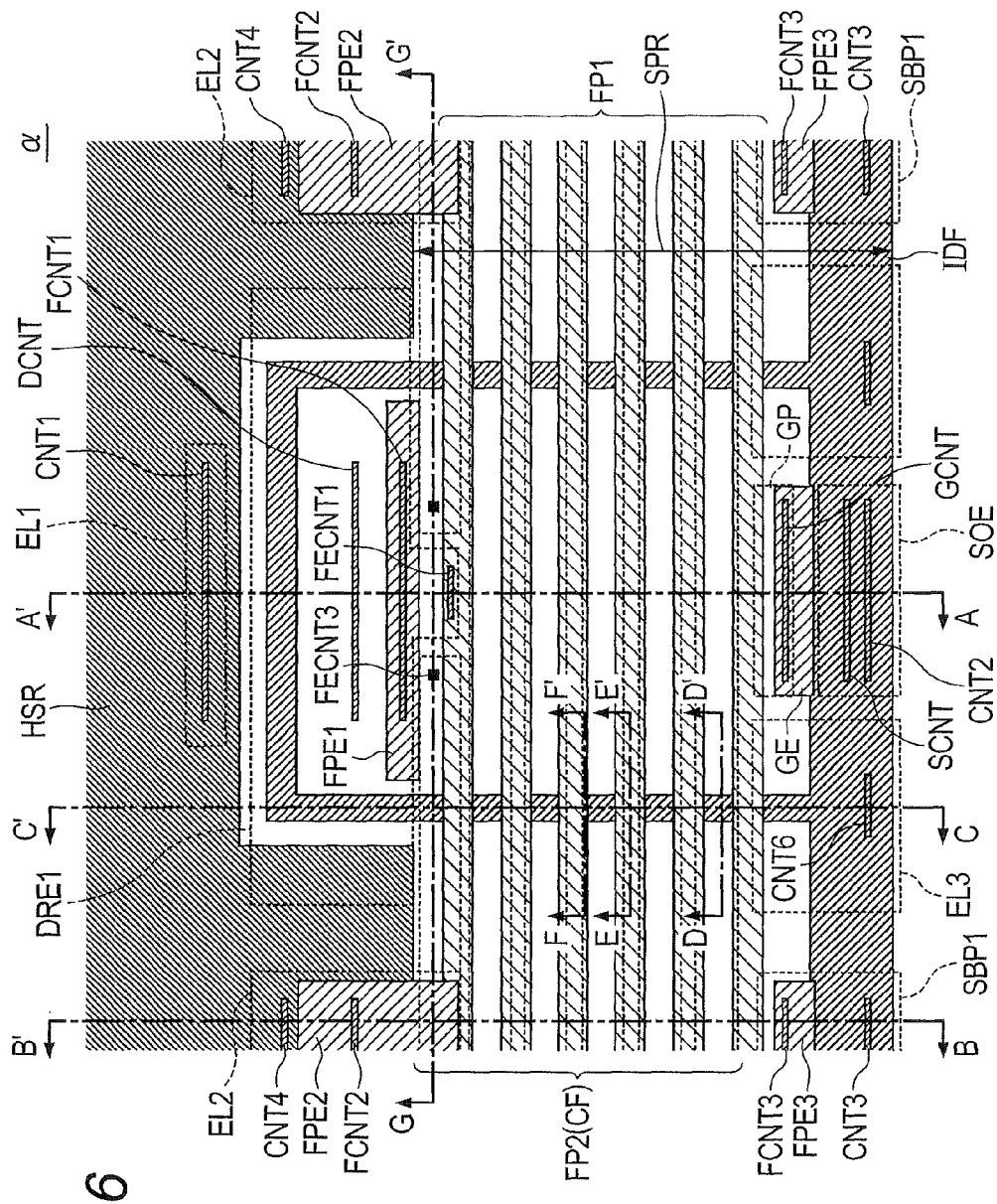
FIG. 26 is an enlarged view of a region enclosed by a dashed line α in FIG. 25.
Figure 27:
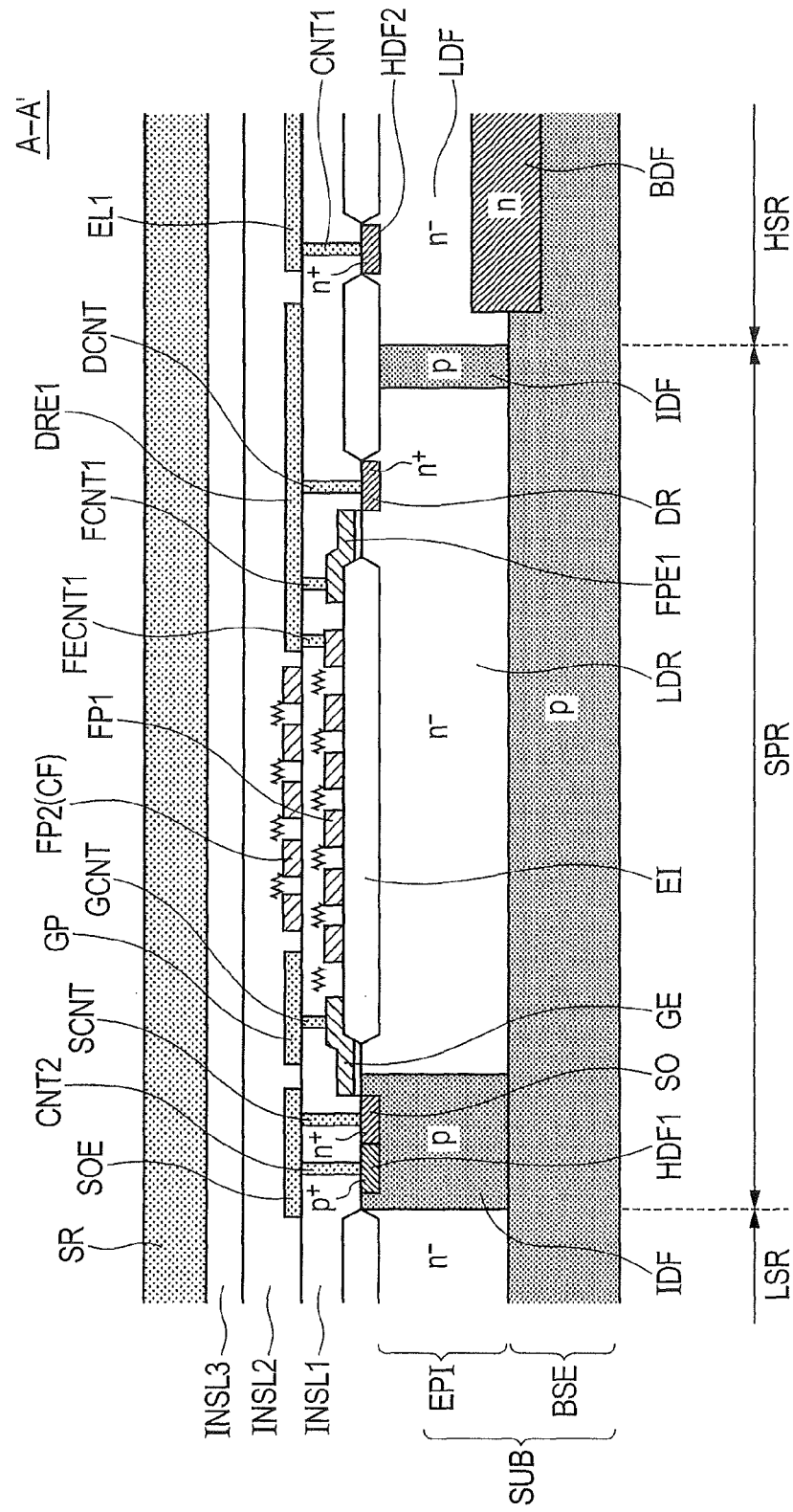
FIG. 27 is a sectional view taken along line A-A' of FIG. 26.
Figure 28:
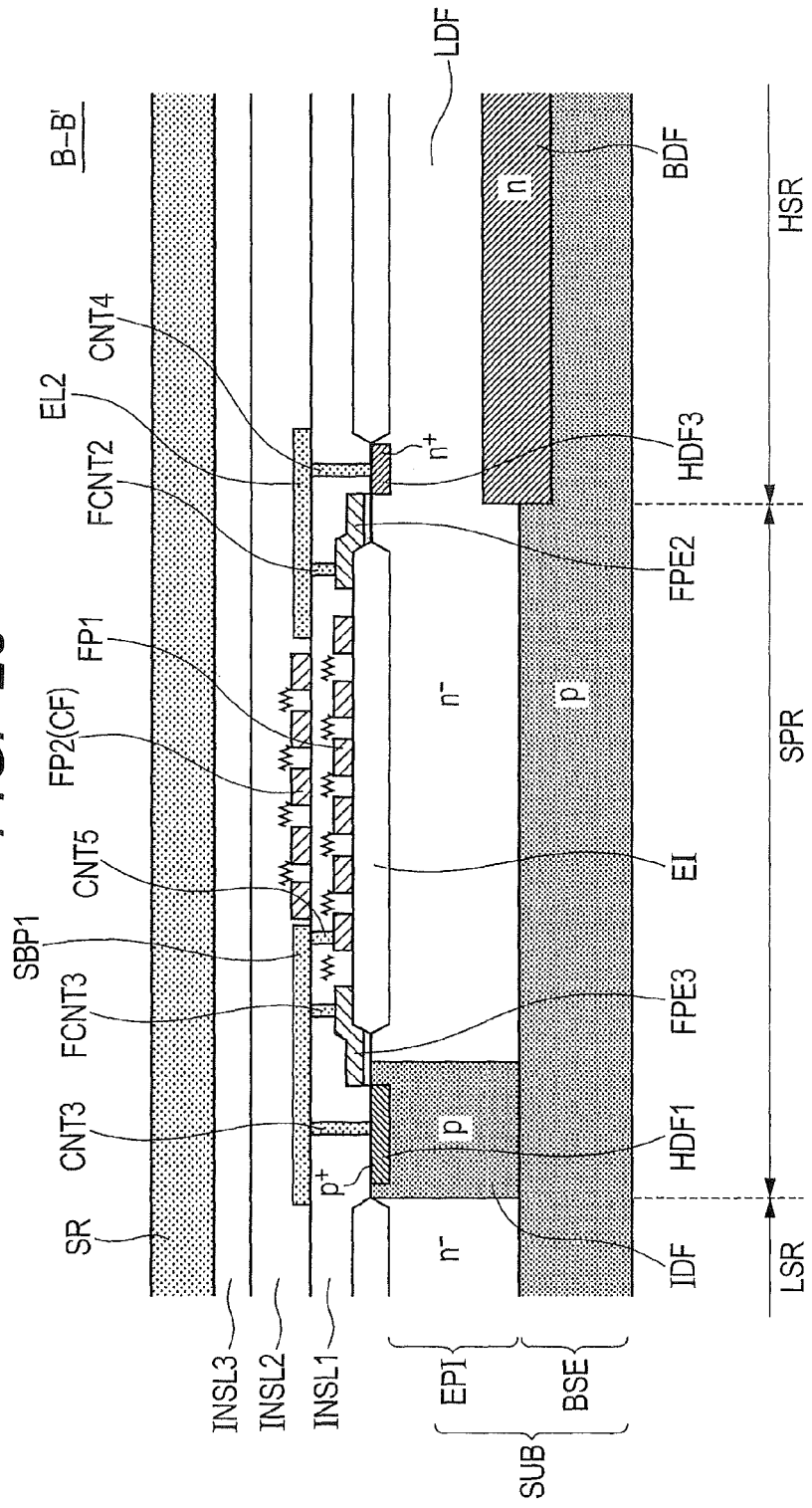
FIG. 28 is a sectional view taken along line B-B' of FIG. 26.
Figure 29:
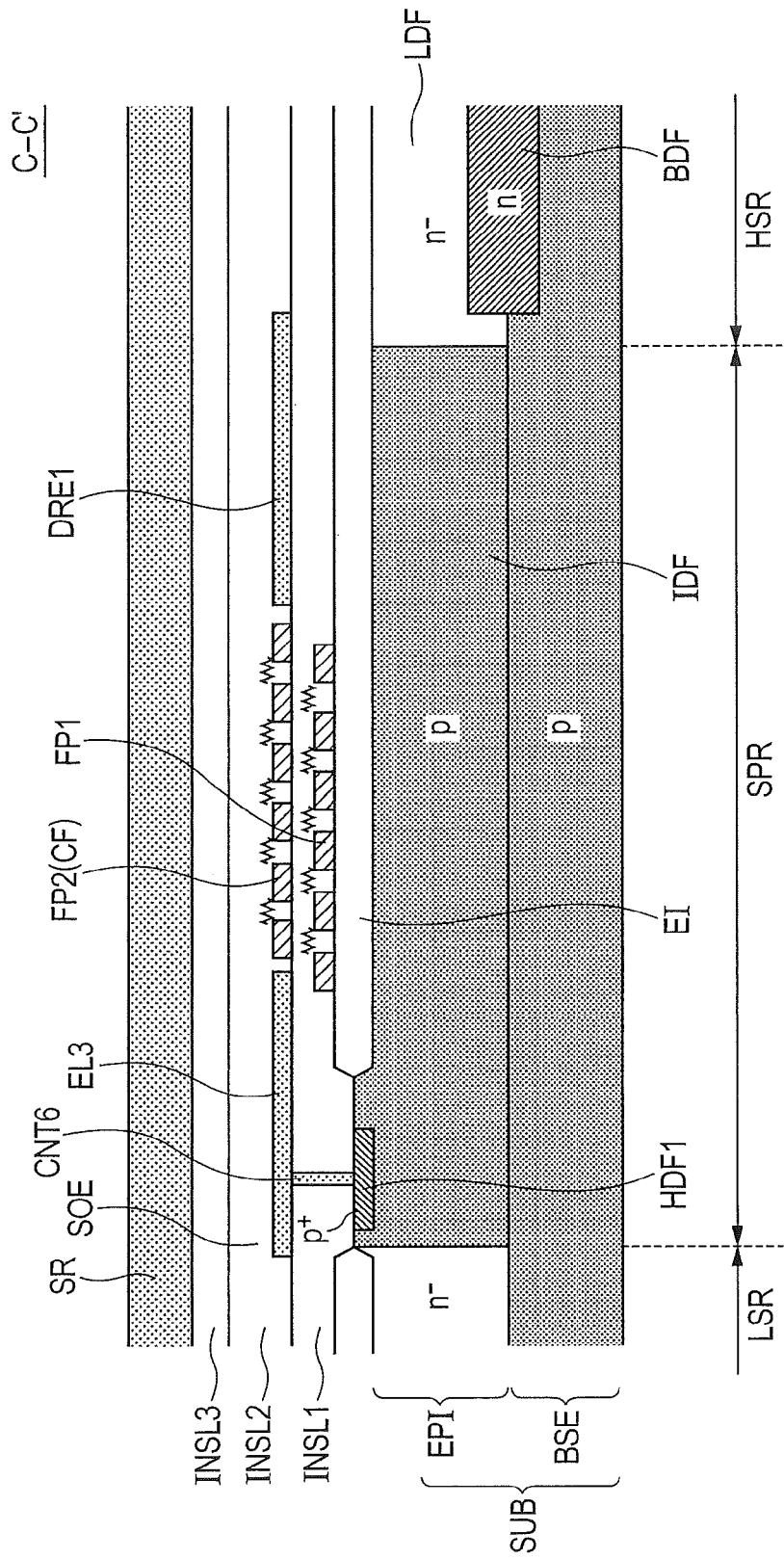
FIG. 29 is a sectional view taken along line C-C' of FIG. 26.
Figure 30:
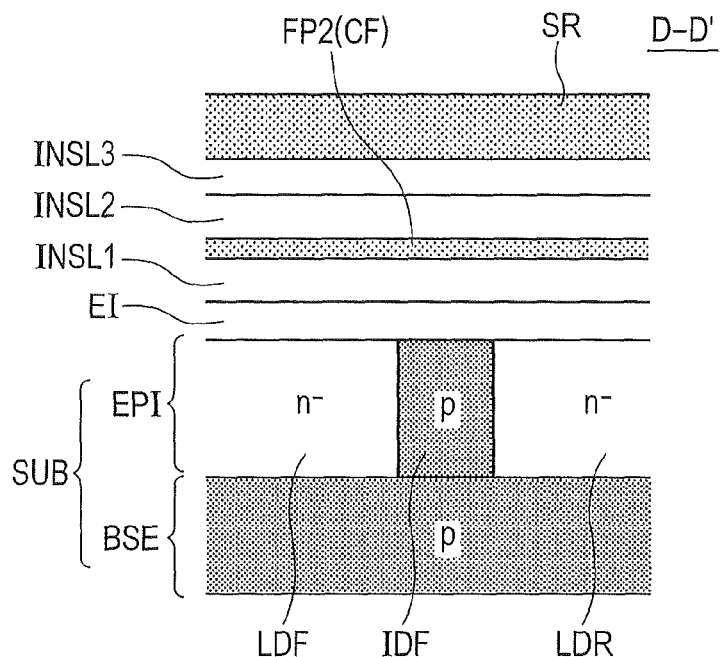
FIG. 30 is a sectional view taken along line D-D' of FIG. 26.
Figure 31:
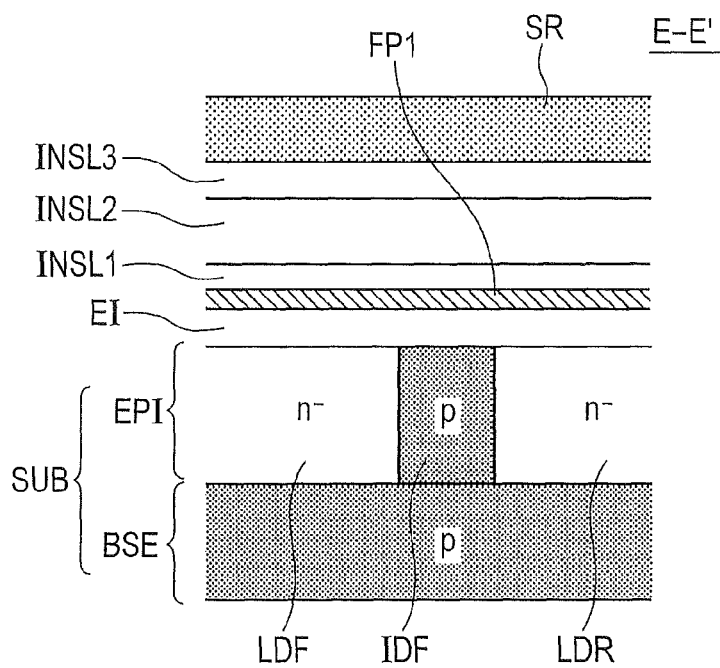
FIG. 31 is a sectional view taken along line E-E' of FIG. 26.
Figure 32:
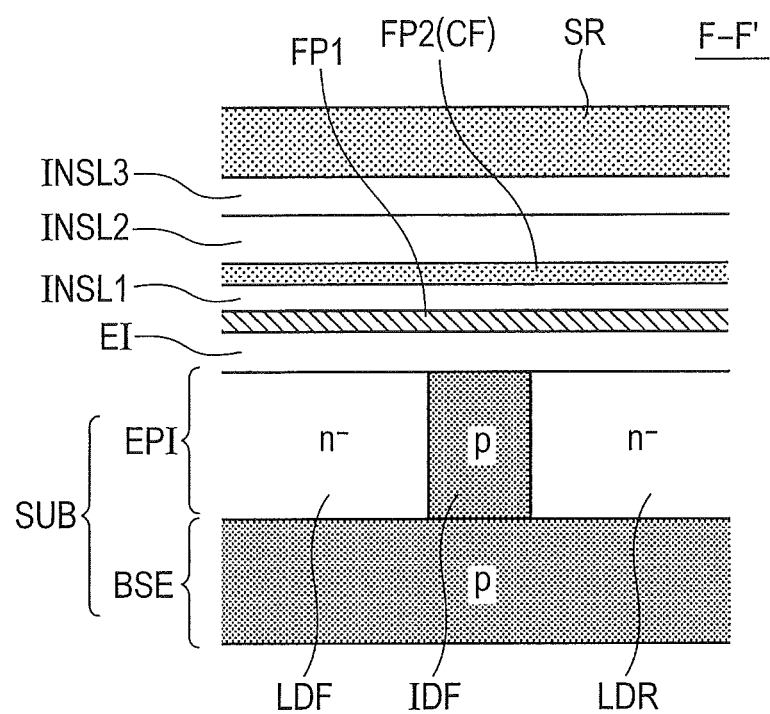
FIG. 32 is a sectional view taken along line F-F' of FIG. 26.
Figure 33:
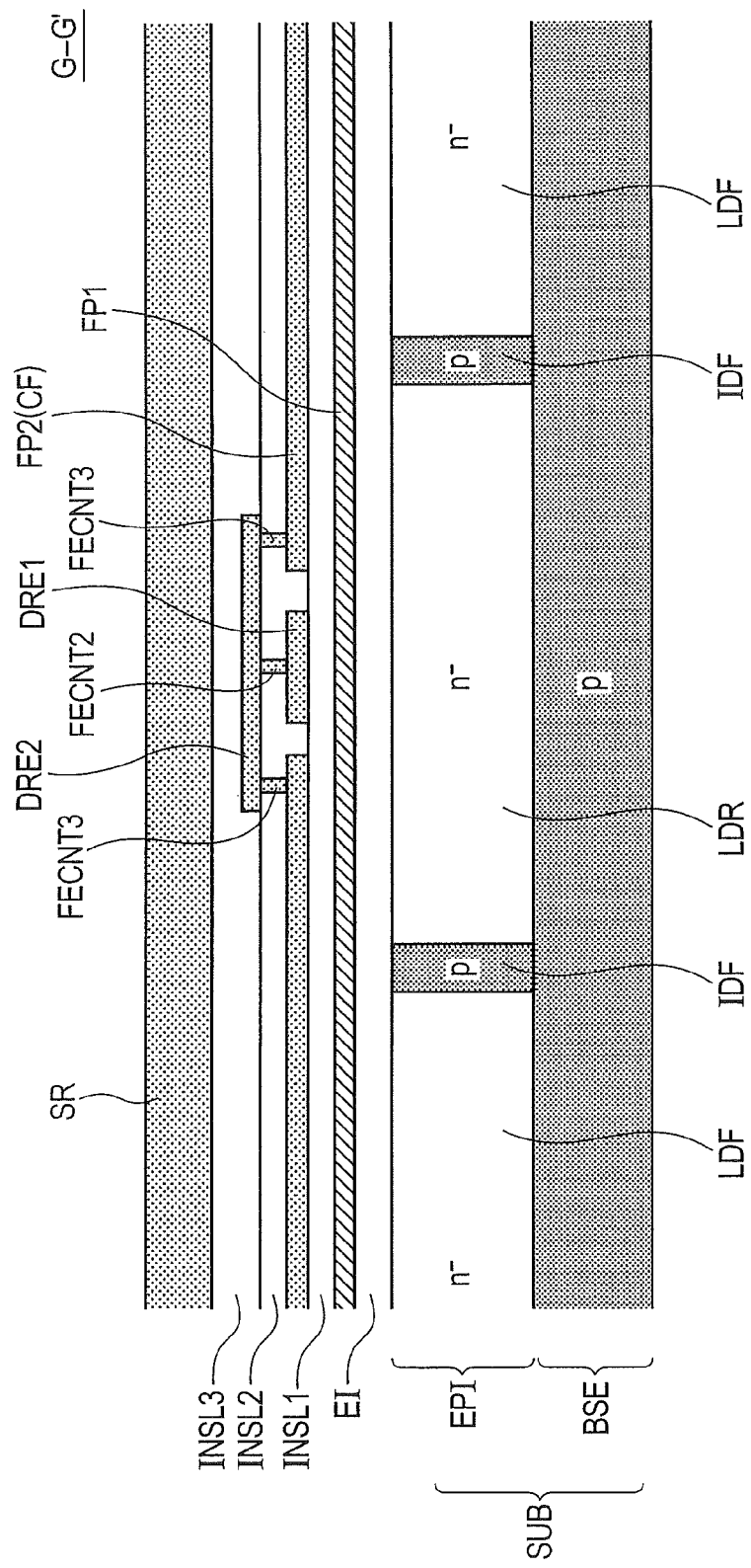
FIG. 33 is a sectional view taken along line G-G' of FIG. 26.
Figure 34:
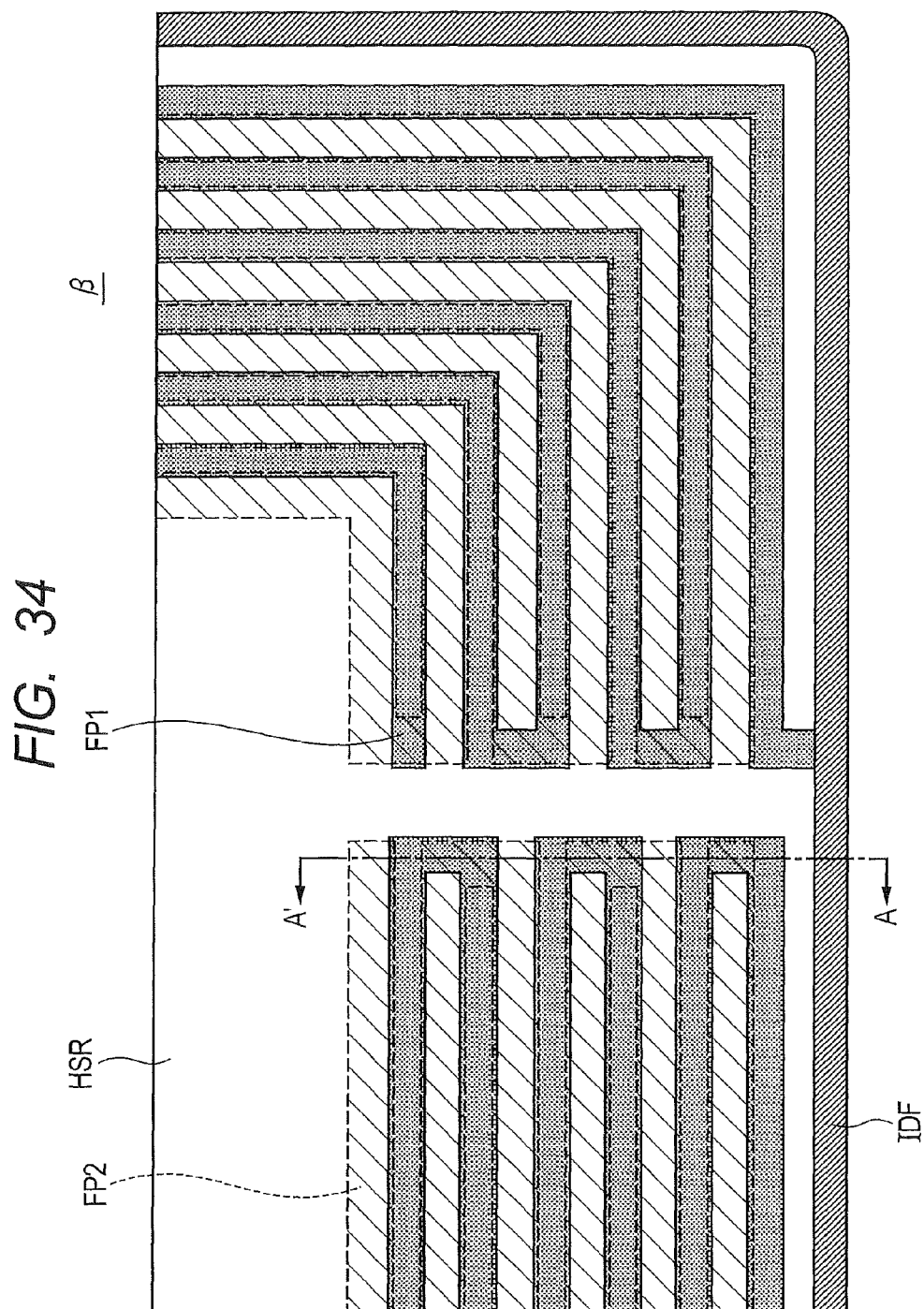
FIG. 34 is an enlarged view of a region enclosed by a dashed line β in FIG. 25.
Figure 35:
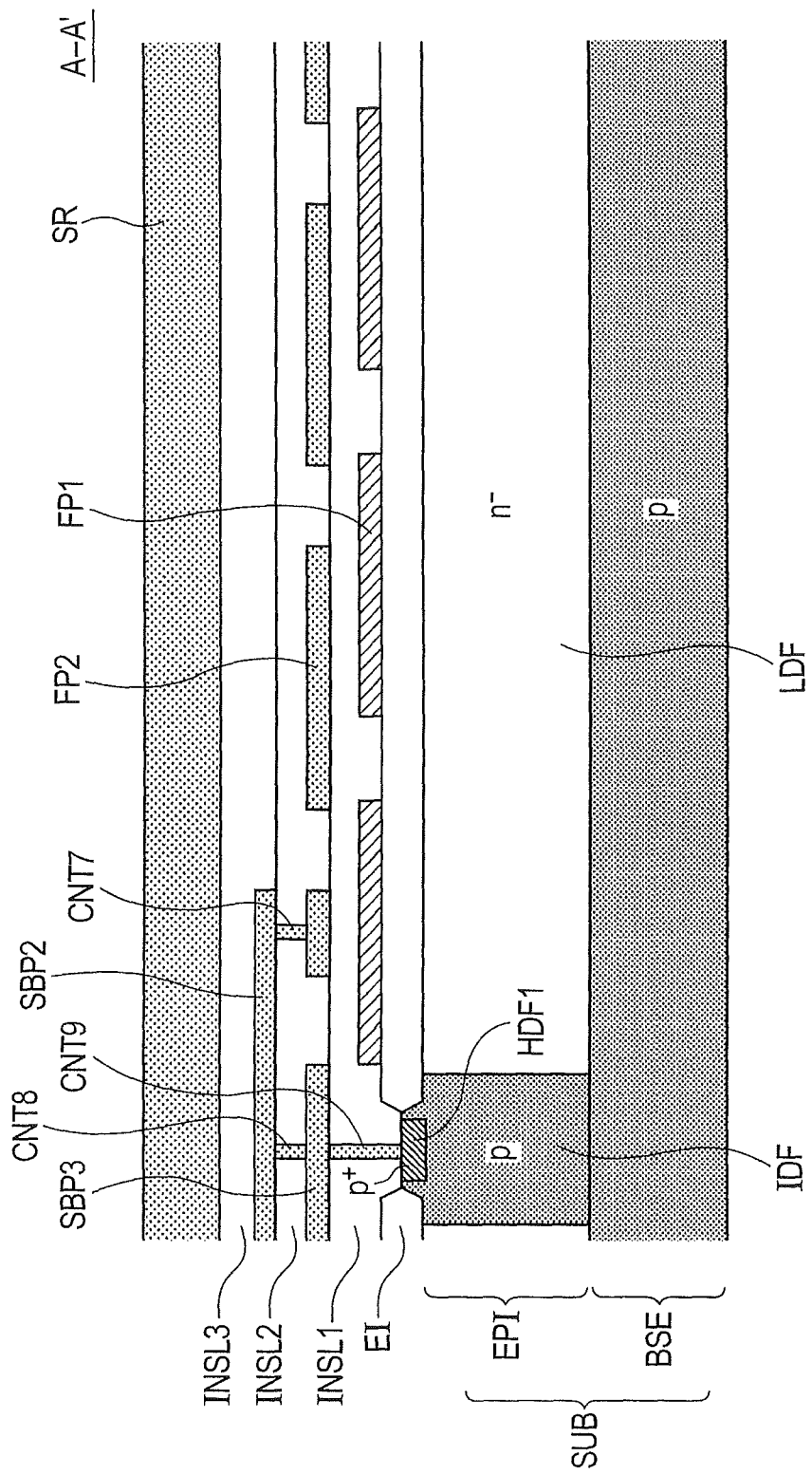
FIG. 35 is a sectional view taken along line A-A' of FIG. 34.

FIG. 25 is a plan view showing the configuration of a semiconductor device SD according to the fourth embodiment, and corresponds to FIG. 2 of the first embodiment. FIG. 26 is an enlarged view of a region enclosed by a dashed line α in FIG. 25, and corresponds to FIG. 3 of the first embodiment. FIGS. 27 to 32 are sectional views taken along lines A-A' to F-F' of FIG. 26, and correspond to FIGS. 4 to 9 of the first embodiment. FIG. 33 is a sectional view taken along line G-G' of FIG. 26. FIG. 34 is an enlarged view of a region enclosed by a dashed line β in FIG. 25. FIG. 35 is a sectional view taken along line A-A' of FIG. 34. The semiconductor device SD according to this embodiment has the same configuration as that of the first embodiment except for the following points.

In this embodiment, the separation region SPR includes a field plate FP2. The field plate FP2 is located over the field plate F2 through the interlayer insulator INSL1, and overlaps with the element separation film EI in plan view. Further, like the field plate FP1 according to the first embodiment, the field plate FP2 is provided in a repetitive folded or spiral fashion along the edge of the first circuit region HSR, as shown in FIG. 34. That is, the field plate FP2 is a resistive field plate.

The field plate FP2 is electrically coupled to the drain electrode DRE1 of the transistor TR at a portion located on the first circuit region HSR side from the center in the width direction of the separation region SPR, like the field plate FP1 according to the first embodiment. Further, the ground potential or the power supply potential of the control circuit LGC (second circuit) is applied to the field plate FP2 at a portion located on the second circuit region LSR side from the center. In this example, the field plate FP2 is electrically coupled to the drain electrode DRE1 of the transistor TR at the innermost periphery. Further, the field plate FP2 is coupled to the ground potential or the second circuit region LSR at the outermost periphery. However, the field plate FP2 may be electrically coupled to an electrode different from the drain electrode DRE1 in the first circuit region HSR. In this case, the voltage of the electrode coupled to the field plate FP2 is lower than the ground potential and the power supply potential of the control circuit LGC.

The field plates FP1 and FP2 are provided alternately in plan view in a region from the first circuit region HSR side toward the second circuit region LSR side. Thus, the field plate FP2 functions as the conductive film CF in the first embodiment. That is, in this embodiment, the conductive film CF is part of the field plate FP2.

As shown in FIG. 33, the field plate FP2 is electrically coupled to the drain electrode DRE1 through a contact FECNT3, a drain electrode DRE2, and a contact FECNT2.

In the example shown in FIG. 33, the drain electrode DRE1 is covered with the interlayer insulator INSL2. Further, an interlayer insulator INSL3 is provided over the interlayer insulator INSL2. The drain electrode DRE2 is covered with the interlayer insulator INSL3. Further, the drain electrode DRE2 is coupled to the drain electrode DRE1 through the contact FECNT2 embedded in the interlayer insulator INSL2. Further, the drain electrode DRE2 is coupled to the field plate FP2 through the contact FECNT3 embedded in the interlayer insulator INSL2. Thus, the field plate FP2 is electrically coupled to the drain electrode DRE1.

Further, as shown in FIG. 35, the field plate FP2 is coupled through a contact CNT7, an electrode SBP2, a contact CNT8, an electrode SBP3, and a contact CNT9 to the high density layer HDF1 of the second conductivity type provided in the second conductivity type region IDF. The electrode SBP2 is covered with the interlayer insulator INSL3. The electrode SBP3 is covered with the interlayer insulator INSL2 under the interlayer insulator INSL3. Further, the electrode SBP2 is coupled to the field plate FP2 through the contact CNT7 embedded in the interlayer insulator INSL2. Further, the electrode SBP2 is coupled to the electrode SBP3 through the contact CNT8 embedded in the interlayer insulator INSL2. Further, the electrode SBP3 is coupled to the high density layer HDF1 through the contact CNT9 embedded in the interlayer insulator INSL1. Thus, the field plate FP2 is coupled to the ground potential.

The field plate FP2 is a resistive field plate, and has the same configuration as the field plate FP1 according to the first embodiment. Accordingly, there is a decrease in the potential of the field plate FP2 from the first circuit region HSR toward the second circuit region LSR, as in the field plate FP1 according to the first embodiment.

Further, by appropriately setting the resistance value of the field plate FP2, the potential of the field plate FP2 (conductive film CF) can be equal to or lower than the potential of the field plate FP1 adjacent to the conductive film CF on the second circuit region LSR side in plan view. Thus, in this embodiment as well, the semiconductor device SD can obtain the same effect as in the first embodiment.

While the invention made above by the present inventors has been described specifically based on the illustrated embodiments, the present invention is not limited thereto. It is needless to say that various changes and modifications can be made thereto without departing from the spirit and scope of the invention.

What is claimed is:

1. A semiconductor device, comprising:
   a first circuit region in which a first circuit whose power supply potential is a first voltage is formed;
   a second circuit region in which a second circuit whose power supply potential is a second voltage lower than the first voltage is formed;
   a separation region which separates the first circuit region from the second circuit region; and
   a transistor which is located in the separation region and couples the second circuit to the first circuit and whose source and drain are of a first conductivity type,
   the separation region comprising:
      an element separation film;
      a first field plate which overlaps with the element separation film in plan view;
      a plurality of conductive films which are provided over the first field plate;
      a second conductivity type region which overlaps with the element separation film in plan view, and is located around the transistor;
      a first conductivity type region which is located opposite to the source or drain of the transistor across the second conductivity type region; and
      a polyimide (SR) which overlaps with the element separation film in plan view,
   wherein at least one of the conductive films has a potential lower than the potential of the first field plate,
   wherein the at least one conductive film is next to a vicinity of the second circuit region and covers at least part of the second conductivity type region,
   wherein a voltage of a drain electrode of the transistor or a voltage of another electrode in the first circuit region is applied to the first field plate on the first circuit region side,
   wherein a ground potential or the second voltage is applied to the first field plate on the second circuit region side, and
   wherein between the first field plate to which the voltage of the drain electrode is applied and the first field plate to which the ground potential or the second voltage is applied, the potential of the first field plate and the potentials of the conductive films are equal to or higher than the ground potential or the second voltage and are equal to or lower than the voltage of the drain electrode.

2. The semiconductor device according to claim 1, wherein the at least one conductive film is electrically coupled through a via to either of the first field plate adjacent to the at least one conductive film on the first circuit region side in plan view and the first field plate adjacent to the at least one conductive film on the second circuit region side in plan view.

3. The semiconductor device according to claim 2, wherein the at least one conductive film is electrically coupled through the via to the first field plate adjacent to the at least one conductive film on the second circuit region side in plan view.

4. The semiconductor device according to claim 1, wherein adjacent first field plates are electrically floating to each other.

5. The semiconductor device according to claim 1, wherein the conductive films are spaced apart from each other, and covered with a silicon rich oxide.

6. The semiconductor device according to claim 1, wherein the conductive films are a part of a second field plate located over the first field plate, and
   wherein the second field plate overlaps with the element separation film in plan view, is provided in a repetitive folded or spiral fashion along the edge of the first circuit region, is electrically coupled to the drain electrode of the transistor or said another electrode in the first circuit region at an innermost periphery, and is coupled to the ground potential or the second circuit at an outermost periphery.

7. The semiconductor device according to claim 1, wherein the first field plate is provided in a repetitive fashion along an edge of the first circuit region.

8. The semiconductor device according to claim 1, wherein there is a decrease in a potential of the first field plate and potentials of the conductive films from the first circuit region toward the second circuit region.

9. The semiconductor device according to claim 1, further comprising:
   a substrate, the first and second circuit regions and the element separation film being formed in the substrate,
   wherein the second circuit region is located outside the separation region in plan view.

10. The semiconductor device according to claim 1, wherein in a region where a portion of the second conductivity type region, extending from a first circuit region side toward a second circuit region side and the element separation film overlap each other in plan view, the first field plate and the conductive films are provided alternately from the first circuit region side toward the second circuit region side in plan view.

11. A semiconductor device, comprising:
   a first circuit region in which a first circuit whose power supply potential is a first voltage is formed;
   a second circuit region in which a second circuit whose power supply potential is a second voltage lower than the first voltage is formed;
   a separation region which separates the first circuit region from the second circuit region; and
   a transistor which is located in the separation region and couples the second circuit to the first circuit and whose source and drain are of a first conductivity type,
   the separation region comprising:
      an element separation film;
      a first field plate which overlaps with the element separation film in plan view;
      a plurality of conductive films which are provided over the first field plate;
      a second conductivity type region which overlaps with the element separation film in plan view, and is located around the transistor;
      a first conductivity type region which is located opposite to the source or drain of the transistor across the second conductivity type region; and
      a polyimide (SR) which overlaps with the element separation film in plan view,
   wherein at least one of the conductive films has a potential lower than the potential of the first field plate,
   wherein the at least one conductive film is next to a vicinity of the second circuit region and covers at least part of the second conductivity type region, and
   wherein at least two conductive films adjacent to each other are coupled to each other, are electrically coupled through a via to the first field plate overlapping with the conductive films in plan view, and cover at least a part of the second conductivity type region between the first field plate coupled to the conductive films and an adjacent first field plate on the first circuit region side without space in the extension direction of the second conductivity type region.

12. The semiconductor device according to claim 11, wherein the at least one conductive film is electrically coupled through a via to either of the first field plate adjacent to the at least one conductive film on the first circuit region side in plan view and the first field plate adjacent to the at least one conductive film on the second circuit region side in plan view.

13. The semiconductor device according to claim 12, wherein the at least one conductive film is electrically coupled through the via to the first field plate adjacent to the at least one conductive film on the second circuit region side in plan view.

14. The semiconductor device according to claim 11, wherein adjacent first field plates are electrically floating to each other.

15. The semiconductor device according to claim 11, wherein the conductive films are spaced apart from each other, and covered with a silicon rich oxide.

16. The semiconductor device according to claim 11, wherein the conductive films are part of a second field plate located over the first field plate, and
   wherein the second field plate overlaps with the element separation film in plan view, is provided in a repetitive folded or spiral fashion along the edge of the first circuit region, is electrically coupled to a drain electrode of the transistor or another electrode in the first circuit region at an innermost periphery, and is coupled to a ground potential or the second circuit at an outermost periphery.

17. The semiconductor device according to claim 11, wherein the first field plate is provided in a repetitive fashion along an edge of the first circuit region.

18. The semiconductor device according to claim 11, wherein there is a decrease in a potential of the first field plate and potentials of the conductive films from the first circuit region toward the second circuit region.

19. The semiconductor device according to claim 11, further comprising:
   a substrate, the first and second circuit regions and the element separation film being formed in the substrate,
   wherein the second circuit region is located outside the separation region in plan view.

20. The semiconductor device according to claim 11, wherein in a region where a portion of the second conductivity type region, extending from a first circuit region side toward a second circuit region side and the element separation film overlap each other in plan view, the first field plate and the conductive films are provided alternately from the first circuit region side toward the second circuit region side in plan view.

21. A semiconductor device, comprising:
   a first circuit region in which a first circuit whose power supply potential is a first voltage is formed;
   a second circuit region in which a second circuit whose power supply potential is a second voltage lower than the first voltage is formed;
   a separation region which separates the first circuit region from the second circuit region; and
   a transistor which is located in the separation region and couples the second circuit to the first circuit and whose source and drain are of a first conductivity type,
   the separation region comprising:
      an element separation film;
      a first field plate which overlaps with the element separation film in plan view;
      a plurality of conductive films which are provided over the first field plate;
      a second conductivity type region which overlaps with the element separation film in plan view, and is located around the transistor;
      a first conductivity type region which is located opposite to the source or drain of the transistor across the second conductivity type region; and
      a polyimide (SR) which overlaps with the element separation film in plan view,
   wherein at least one of the conductive films has a potential lower than the potential of the first field plate,
   wherein the at least one conductive film is next to a vicinity of the second circuit region and covers at least part of the second conductivity type region, and
   wherein the first field plate is provided in a repetitive folded or spiral fashion along the edge of the first circuit region, is electrically coupled to a drain electrode of the transistor or another electrode in the first circuit region at an innermost periphery, and is coupled to a ground potential or the second circuit at an outermost periphery.

22. The semiconductor device according to claim 21, wherein the at least one conductive film is electrically coupled through a via to either of the first field plate adjacent to the at least one conductive film on the first circuit region side in plan view and the first field plate adjacent to the at least one conductive film on the second circuit region side in plan view.

23. The semiconductor device according to claim 22, wherein the at least one conductive film is electrically coupled through the via to the first field plate adjacent to the at least one conductive film on the second circuit region side in plan view.

24. The semiconductor device according to claim 21, wherein adjacent first field plates are electrically floating to each other.

25. The semiconductor device according to claim 21, wherein the conductive films are spaced apart from each other, and covered with a silicon rich oxide.

26. The semiconductor device according to claim 21, wherein the conductive films are part of a second field plate located over the first field plate, and
    wherein the second field plate overlaps with the element separation film in plan view, is provided in a repetitive folded or spiral fashion along the edge of the first circuit region, is electrically coupled to the drain electrode of the transistor or said another electrode in the first circuit region at the innermost periphery, and is coupled to the ground potential or the second circuit at the outermost periphery.

27. The semiconductor device according to claim 21, wherein the first field plate is provided in a repetitive fashion along an edge of the first circuit region.

28. The semiconductor device according to claim 21, wherein there is a decrease in a potential of the first field plate and potentials of the conductive films from the first circuit region toward the second circuit region.

29. The semiconductor device according to claim 21, further comprising:
    a substrate, the first and second circuit regions and the element separation film being formed in the substrate,
    wherein the second circuit region is located outside the separation region in plan view.

30. The semiconductor device according to claim 21, wherein in a region where a portion of the second conductivity type region, extending from a first circuit region side toward a second circuit region side and the element separation film overlap each other in plan view, the first field plate and the conductive films are provided alternately from the first circuit region side toward the second circuit region side in plan view.

* * * * *